(12) United States Patent
Hudek et al.

(10) Patent No.: US 7,435,517 B2
(45) Date of Patent: Oct. 14, 2008

(54) METHOD FOR REDUCING THE FOGGING EFFECT

(75) Inventors: Peter Hudek, Jena (DE); Dirk Beyer, Weimar (DE); Lemke Melchior, Jena-Cospeda (DE)

(73) Assignee: Vistec Electron Beam GmbH, Jena (DE)

( * ) Notice: Subject to any disclaimer, the term of this patent is extended or adjusted under 35 U.S.C. 154(b) by 359 days.

(21) Appl. No.: 11/165,500

(22) Filed: Jun. 23, 2005

(65) Prior Publication Data

US 2005/0287451 A1   Dec. 29, 2005

(30) Foreign Application Priority Data

Jun. 29, 2004   (EP)   .................................. 04103019
Jul. 22, 2004   (EP)   .................................. 04103497

(51) Int. Cl.
   *G03C 5/00*   (2006.01)
(52) U.S. Cl. .......................... 430/30; 430/296; 430/942
(58) Field of Classification Search ................... 430/30, 430/296, 942
   See application file for complete search history.

(56) References Cited

FOREIGN PATENT DOCUMENTS

JP      11204415       7/1999

OTHER PUBLICATIONS

Cui, Zheng, et al., "Proximity Correction of Chemically Amplified Resists for Electron Beam Lithography," Microelectronic Engineering 41/42 (1998) pp. 183-186.
Simecek, Michal, et al., "A New Approach of E-beam Proximity Effect Correction for High-Resolution Applications," JPN. J. Appl. Phys., vol. 37 (1998) pp. 6774-6778.
Park, D., et al., "Modeling and Correction of Global CD Uniformity Caused by Fogging and Loading Effects in 90nm Node CAR Processes," Proc. of SPIE, vol. 5130 (2003) pp. 78-85.
Yang, Seung-Hune, et al. , "Proximity Effect Correction Optimization Considering Fogging and Loading Effects Compensation," Proc. of SPIE, vol. 4689 (2002), pp. 977-984.
Yang, Seung-Hune, et. al., "Fogging Effect Consideration in Mask Process at 50KeV E-Beam Systems," Proc. of SPIE, vol. 4889 (2002), pp. 786-791.
Park, Eui Sang, et al., "Optimum PEC Conditions Under Resist Heating Effect Reduction for 90nm Node Mask Writing," Proc. SPIE, vol. 4889, Part Two, pp. 792-799, 2005.
Stevens, L., et al., "Determination of the Proximity Parameters in Electron Beam Lithography Using Doughnut-Structures," Microelectronics Engineering 5 (1986) pp. 141-150.
Rishton, S.A., et al., "Point exposure distribution measurements for proximity correction in electron beam lithography on a sub-100nm scale," Journal of Vacuum Science & Technology B (Microelectronics Processing and Phenomena) USA, vol. 5, No. 1, pp. 135-141, 2005.
Misaka, Akio, et al., "Determination of Proximity Effect Parameters in Electron-Beam Lithography," J. Appl. Physics, vol. 68, No. 12, Dec. 15, 1990, pp. 6472-6479.

*Primary Examiner*—Christopher G Young
(74) *Attorney, Agent, or Firm*—Houston Eliseeva LLP

(57) ABSTRACT

A method for reducing the fogging effect in an electron beam lithography system wherein the exposure is controlled in order to obtain resulting pattern after processing which conforms to design data. A model for the fogging effect is fitted by individually changing at least the basic input parameters of the control function, the function type is chosen in accordance to the Kernel type used in the proximity corrector. The proximity effect is considered as well and an optimized set of parameters is obtained in order to gain a common control function for the proximity and fogging effect. The pattern writing with an e-beam lithographic system is controlled by the single combined proximity effect control function and the fogging effect control function in only one data-processing step using the same algorithms as are implemented in a standard proximity corrector.

8 Claims, 25 Drawing Sheets

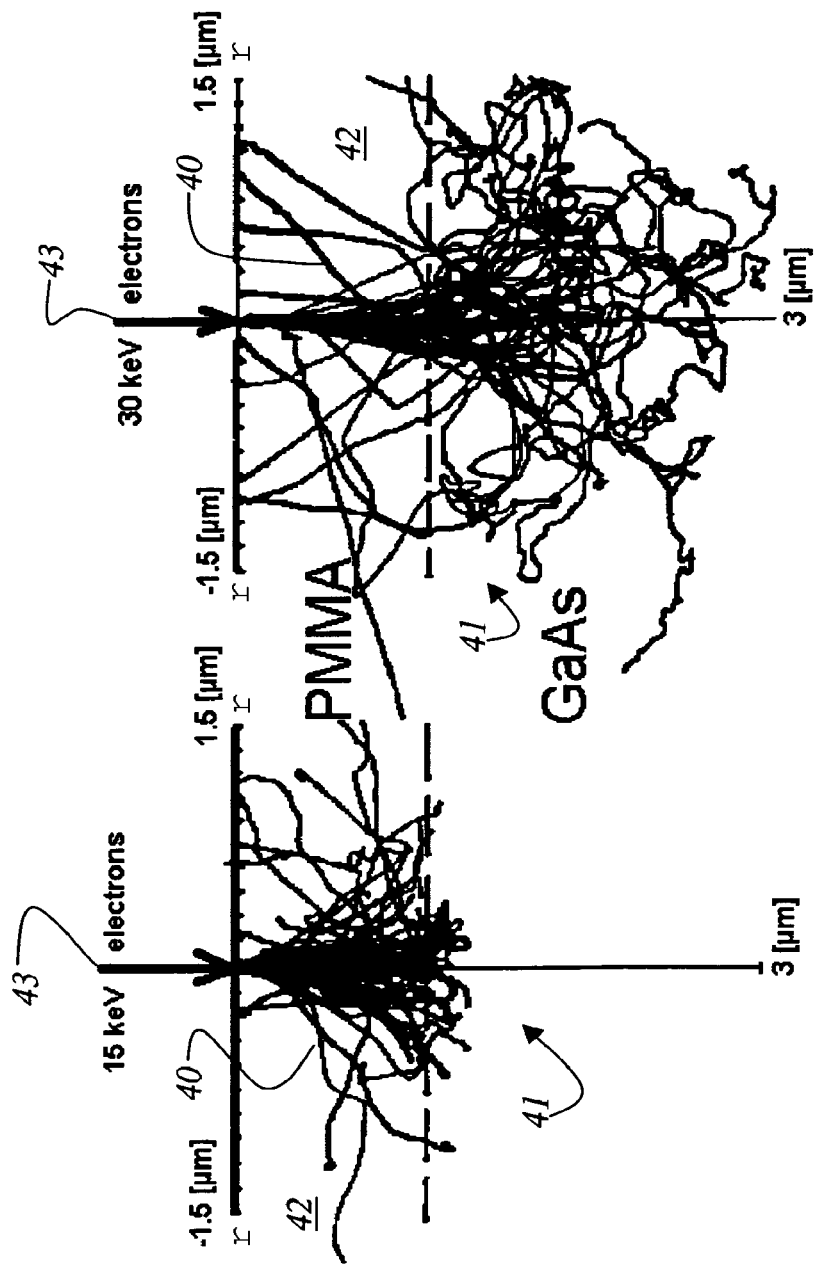

| Duty Ratio | Ratio | Measured [μm] | Calculated [μm] |
|---|---|---|---|
| (1:1) | 1 | 0,649 | 0,649 |
| (1:1,2) | 1,2 | 0,645 | 0,644 |
| (1:1,4) | 1,4 | 0,642 | 0,639 |
| (1:1,6) | 1,6 | 0,639 | 0,636 |
| (1:1,8) | 1,8 | 0,635 | 0,633 |
| (1:2) | 2 | 0,633 | 0,631 |
| (1:3) | 3 | 0,625 | 0,622 |
| (1:4) | 4 | 0,618 | 0,617 |
| (1:5) | 5 | 0,614 | 0,614 |
| (1:10) | 10 | 0,607 | 0,607 |
| (1:20) | 20 | 0,6 | 0,602 |

METHOD FOR REDUCING THE FOGGING EFFECT

RELATED APPLICATIONS

This application claims priority of the European patent applications EP 04 103 019.8 and EP 04 103 497.6 which are incorporated by reference herein.

FIELD OF THE INVENTION

The invention refers to process for controlling the proximity effect correction in an electron beam lithography system. The process is suitable for precise numerical determination of the proximity parameters of the Point Spread Function (PSF) for optimised controlling the proximity correction in the high-resolution electron beam lithography (EBL).

BACKGROUND OF THE INVENTION

The proximity effect parameters are specific numerical inputs to control an arbitrary Proximity-Effect correction software. This satisfies high Critical Dimension control "CD-control" requirements (depending on actual International Technology Roadmap for Semiconductors ITRS from International SEMATECH) as well as to compensate pattern bias in the Mask and/or Direct-Write working with Gaussian and/or Shaped beam in connection with the subsequent technology steps (development, etching, etc.).

Many methods have been proposed for the determination of the proximity parameters reflecting various effectiveness. In addition to the proximity effect a fogging effect occurs simultaneously in a electron beam lithographic system. There are several publications, which deal with the proximity effect correction.

The article "Optimum PEC Conditions Under Resist Heating Effect Reduction for 90 nm Node Mask Writing"; disclosed in Proc. SPIE, Vol. 4889, Part Two, pp 792-799 (paper No. 86), show the problem of 50 kV e-beam writing causing critical dimension (CD) change, resist heating and proximity effect. This experimental method is used for determination of the proximity input-parameters in the mask making process using large area matrices of proximity-corrected test patterns written under various conditions with discrete step-by-step individually changed proximity parameters. The optimal parameter set is then determined from direct measurements on these test patterns where the pattern deformation effects are minimal. The experiment and also the pattern evaluation is highly time consuming. Because of the large number of possible combinations of the input parameters, the method is limited to only 2 Gaussian approximation of the resulting PSF. This method is massively used in the mask production.

The article in Microelectronic Engineering 5 (1986) 141-159; North Holland with the title "Determination of the Proximity Parameters in Electron Beam Lithography Using Doughnut-Structures". The test structures, used to determine the parameters for a correction function, are doughnuts. This method offers a straightforward technique for determining the proximity parameters from an array of exposed donuts by means of optical microscopy. This method is not sensitive enough to achieve CD control with an e-beam and not suitable for high-resolution patterning EBL methods.

In the article "Point Exposure Distribution Measurements for Proximity Correction Electron Beam Lithography on a sub-100 nm Scale"; in J. Vac. Sci. Technol. B 5(1), January/February 1987 a single point/pixel is exposed in a wide range of doses and the diameters of the patterns measured and the results directly approximated by Gaussian functions. The method is applicable for special high-contrast resist only (i.e. insensitive to changes in development rate effects), needs high-resolution measurement technique (SEM) and also additional processes ("lift-off" or deposition coatings of patterns). This method may not be applicable to the commercially used Chemically Amplified Resists (CAR). With the point exposure method using extremely high doses, acid diffusion effect may outweigh the true nature of the proximity effect [Z. Cui, Ph.D. Prewett, "Proximity Correction of Chemically Amplified Resists for Electron Beam Lithography" Microelectronic Engineering 41/42 (1998) 183-186].

The article "Determination of Proximity Effect Parameters in Electron-Beam Lithography" in J. Appl. Phys. 68 (12), 15. December 1990, discloses a empirical method for determining the proximity parameters in electron-beam lithography from rectangular array of mesh patterns from which, after the processing proximity parameters should be retrieved by means of light-optical inspection. A test pattern to be measured is used to determine the proximity effect parameters. This method is not suitable for the contemporary conventional high-resolution production e-beam lithography.

In some publications the fogging effect is considered as well. The article "Fogging Effect Consideration in Mask Process at 50 KeV E-Beam Systems" shows a suggestion to reduce the fogging effect in high voltage electron e-beam systems.

SUMMARY OF THE INVENTION

It is the object of the present invention to create a method which allows a reliable correction of the illumination parameters of an e-beam lithographic system by considering the influence of the fogging effect.

The above object is achieved by a method comprising the steps of:

exposing test patterns without—and with fogging impact, i.e. test patterns surrounded by a sufficiently large exposed area with an adequate separation gap between the test pattern and the large exposure area boundary (the test pattern must not be additionally loaded by proximity effect from the large fogging area);

measuring the geometry of the resulting test structures within the test pattern with- and with-out fogging impact and thereby obtaining a set of measurement data showing the influence of the fogging effect (intensity vs. range) on the dimensions as required by the design data;

determining a numerical range of basic fogging input parameters for a one or a set of Gaussian functions $G_{fog}$, (or also other functions—the functions can be chosen in accordance to the Kernel type used in the proximity corrector), describing the fogging effect together with the already determined proximity function, from the set of measurement data (the convolution Kernel has many free options: shape, size, real or complex valued, dependent or independent on the layout, etc.);

fitting a model for the fogging effect by individually changing at least the basic input parameters of the Gaussian function $G_{fog}$, by considering a proximity effect, to measurement data set and thereby obtaining an optimised set of parameters for a common proximity and fogging correction function, applying the common correction function—containing both proximity and fogging—to an exposure control for correction of local CD-linearity and global CD-uniformity of the electron beam lithography system during the exposure of a pattern according to the design data.

Additionally, it is useful to apply the determined parameter set for exposure correction to a calculation and comparison of the results with the measured data set with nominal doses exposed isolated clear and opaque lines with and without fogging impact, "on the Target", (FIG. 21.a). Another possibility is to apply the fitted proximity parameter set to a calculation and a comparison of the results with the measured data set from other arbitrary pattern, which can be for example a pyramid like pattern and comparing the results with the measured data set from measurements in representative points on the test patterns. A further possibility is to apply the fitted proximity parameter set to a calculation and a comparison of the results with the measured data set from other arbitrary pattern, which can be for example a plurality of lines in Duty-Ratio and comparing the results with the measured data set from measurements in representative points on the test patterns.

The method is based on the analysis of the pattern geometry variation as a direct process response (electron energy, resist material, substrate material, pre- and post-exposure processes, pattern transfer, etc.) to non-interacting and/or interacting non-corrected patterns in the EBL. The measured pattern-variation behaviour is computational reconstructed using a back-simulation by inserting the specified proximity parameters into the model. From the model calculated data represent the lateral contour localizations of the simulated pattern at the same points where they were measured on the real pattern. A comparison of measured data with the calculated results at the same points on a representative test pattern with and without fogging impact (single clear/opaque lines, pyramid like patterns, array of lines in duty-ratio, etc.) visualise the quality of the determined parameter set for the control function.

In the case, that the requested requirement.—that the correction algorithms are working under the same model conception as used in the model—is fulfilled, the method all at once also predicts the possible pattern uniformity deviations (pattern conformity) and the resolution limits after using the actually determined proximity parameter set in the proximity correction.

The present invention has the advantage that uses a model-based analyses and interpretations of native geometrical distortions of exposed non-corrected representative patterns (analysing the direct process response as a typical pattern-geometry variation) which are measured in specified points (using commercial measuring tools, e.g. CD-SEM) and the data are recorded for the subsequent processing. A successive "back-simulation" procedure is used for the best possible reconstruction of these effects. "Back-Simulation" means a computational method how to find the optimum numerical input parameter set for the best approximation of the measured geometry variation of a concrete pattern detail in dependence on pre- and post exposure condition and/or proximity (pattern-size and neighbourhood) and fogging effects (=pattern and process reconstruction). Once such a pattern detail can be the dimensional variation of a pattern in a specified point as a function of the exposure intensity (e.g. in the simplest case line width and/or contact dimensional variation vs. exposure dose in both tonalities). Another variable can be for example the location of a neighbourhood pattern (e.g. line width measurements vs. gap width variation of large pads—pyramid-like patterns, and/or lines in gratings—lines in duty-ratio) with and without fogging impact. In consequence, after inserting the obtained parameters into the model, the appropriate simulations should show the same tendency of pattern geometry variations dependency as obtained from measurements. Accordingly, if the correction algorithms are working under the same model conception as used in the model, it results in a good recovery of the parasitic distortion effects using these input parameter sets in the proximity correction. Measurements and simulations can be performed down to the smallest resolvable pattern dimension, which allows also a precise determination of parameters describing the so known "short-range" effects arising from the forward scattering of electrons, secondary electron distribution, beam blur, resist effects (development, acid diffusion, quenching) and pattern transfer (microloading). Consequently, the proximity corrector controlled by an analytical function using this parameter set will be able to work correctly also in the deep sub-100 nm lithography node.

Experimental measurements on a couple of exposed patterns are the precondition to provide all necessary numerical inserts into the PROX-In (PROX-In is a user-friendly Windows™ based software tool serving as a help for lithographers to determine the set of proximity and fogging effect parameters) active-free edit dialog boxes and to create simple ASCII-files containing the measured data. Subsequently these data serve as the basis for the selected particular built-in algorithms required for the proximity and fogging parameter determination in this program. To maximally avoid pattern degradations/distortions with submicron features it is unavoidable to apply a correction method for handling this effect. Existing techniques rely on: a) shot-by-shot modulation of the exposure dose b) a modification of the pattern geometry, or c) combining of both methods mentioned before.

The main advantages of this process is, that it does not employ large matrices of exposed already proximity-corrected patterns with various input parameters. The parameters will be here determined from measurements on non-corrected simple test patterns. The amount of data and/or parameters to be analysed are reduced enormously. The advantage of the present invention is as follows. The present invention uses only a small amount of a relatively simple set of test patterns exposed. In case of the proximity effect parameter determination the substrate (5-inch and larger) area covered by the test pattern which is limited to under 1%. Furthermore the test patterns are exposed without any proximity and fogging correction. Additionally there is the possibility to vary the local and global pattern loading by help of substrate "dummy" exposures of additional assistant patterns around the test patterns. This allows to determine the additional impacts of the pattern load depending fogging effect on changes of bias in the development and/or etching process.

There is the additional possibility to directly observe the tendency of pattern degradation by individual varying the value of one of the input parameters. Then there is an interactive fine-tuning of the input parameters to achieve the best possible CD-requirements (CD-Linearity). For example by using two or more Gaussian input parameter sets (combination of Gaussian functions as a convolution Kernel in the model) with a direct check possibility, where and why the additional Gaussian functions with the various parameters are needed, enable the achievement of better results. The back-simulation and reconstruction of specific pattern details for arbitrary proximity parameter sets allows a prediction of possible changes in the CD for the given parameter set for various geometry combinations of patterns.

A computer program "PROX-In" was developed and realized for optimisation and testing purposes of the method described in this application under real conditions in the production.

The "long range" fogging effect is considered as well. With the combination of the proximity correction control function and the fogging correction into one common control function with the e-beam lithographic system, the dimensional errors are reduced to less than 10 nm in CD-linearity and also in global CD uniformity.

BRIEF DESCRIPTION OF THE DRAWINGS

The nature and mode of operation of the present invention will now be more fully described in the following detailed description of the invention taken with the accompanying drawing figures, in which:

FIG. 4a shows simulated trajectories for 100 electrons scattered in a Poly-(Methyl-MethAcrylate) (PMMA) coated on a GaAs substrate;

FIG. 4b shows simulated trajectories for 100 electrons scattered in a Poly-(Methyl-MethAcrylate) (PMMA) coated on a GaAs substrate, wherein the primary energy of the electrons is higher as in the calculation shown in FIG. 4a;

DETAILED DESCRIPTION OF THE INVENTION

Figure 1:
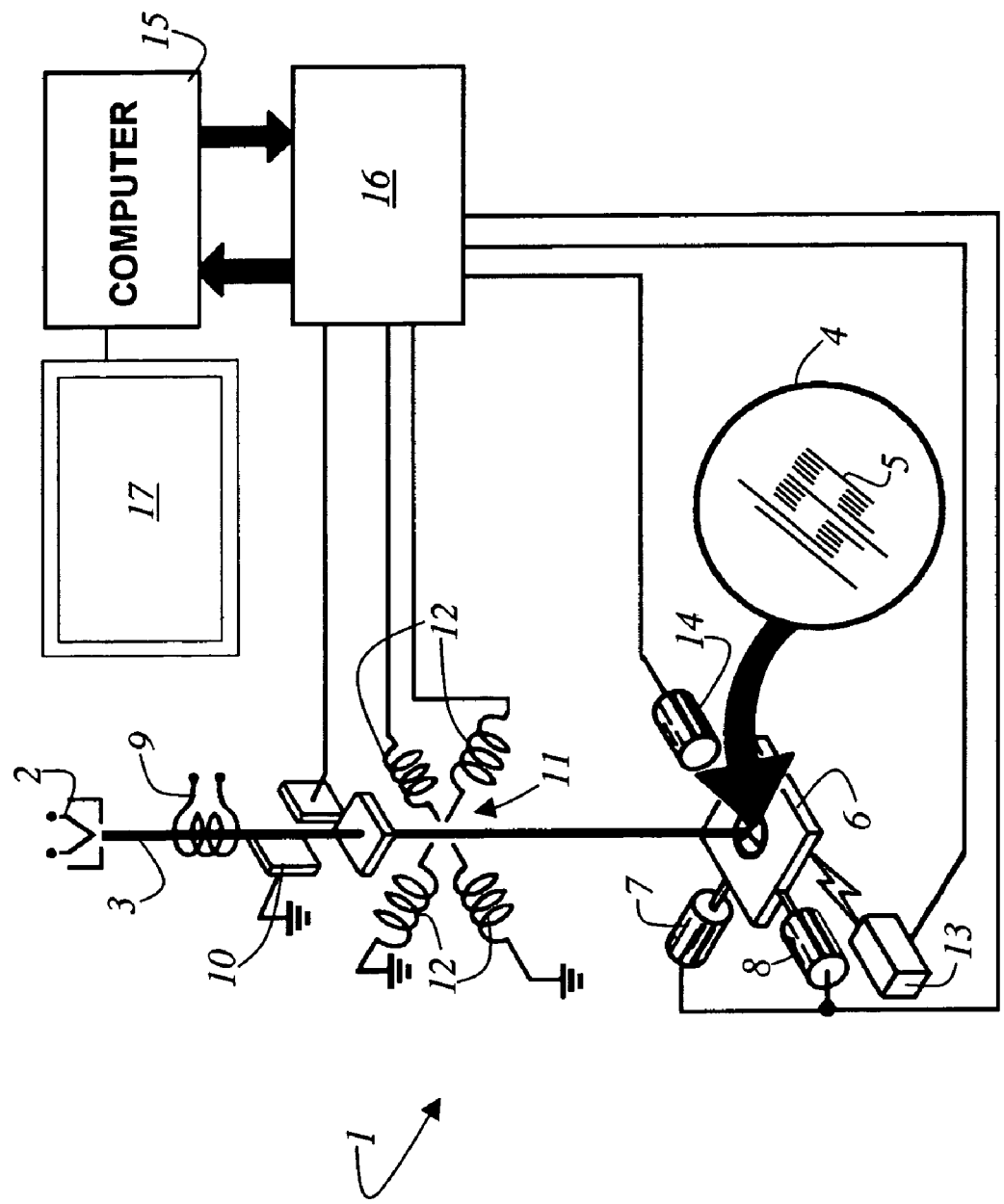
FIG. 1 is a block diagram of an e-beam lithographic system.

FIG. 1 shows a block diagram of an e-beam lithographic system 1. The e-beam lithographic system 1 has a source of electrons 2 which emits an e-beam 3. This specification mentions only the use of an e-beam 3. Nevertheless, it has to be understood that the invention is not limited to e-beams. The invention can be used with particle beams in general, which may he used to write a pattern 5 on a substrate 4. The substrate 4 is placed on a stage 6 which can be moved by motors 7 and 8 in a plane which is spanned by the X-coordinate X and the Y-coordinate Y. The e-beam 3 passes a beam alignment coil 9 after emerging from the e-beam source 2. After the beam alignment coil 9, in the direction of e-beam 3 propagation, a beam blanking unit 10 is provided. After that the e-beam 3 reaches a magnetic deflection unit 11, which comprises in general four magnetic coils 12. After that the e-beam 3 is directed to the substrate 4. As already mentioned the substrate 4 is positioned on the stage 6. The position of the stage is controlled by a position feedback device 13. Additionally, an electron detector 14 is positioned in close proximity of the stage 6. A computer 15 is provided for controlling the whole e-beam lithographic system 1, in particular to control, measure and adjust the beam parameters in order to produce a pattern with needed dimensions. The computer 15 is linked to the e-beam lithographic system 1 by an interface 16, which carries out the analog to digital and/or the digital to analog conversion. The interface 16 is connected to the beam blanking unit 10, the magnetic deflection unit 11, the position feedback device 13, the electron detector 14, and the motors 7 and 8 for moving the stage 6. The user is informed via a display 17 about the settings and/or the adjustment parameters of the e-beam lithographic system 1.

Figure 2A:
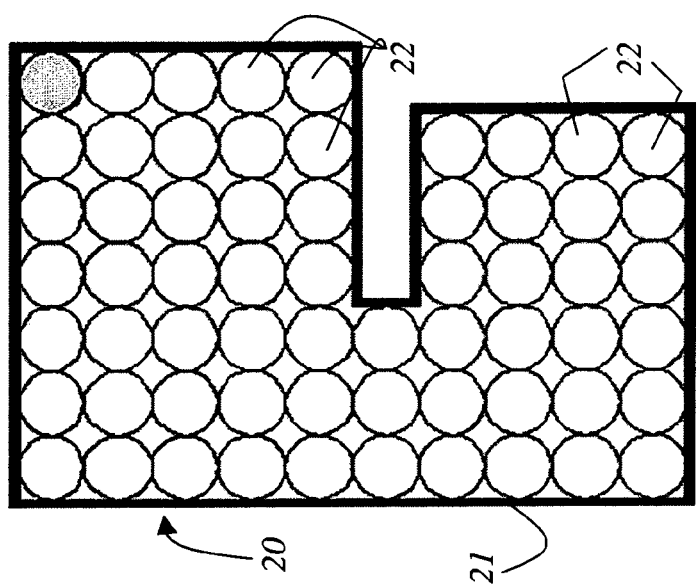
FIG. 2a is an example for a pattern written with a Gaussian electron beam.
Figure 2B:
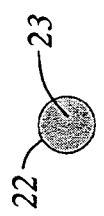
FIG. 2b is the shape of the cross section of the Gaussian electron beam, which has a constant diameter.

FIG. 2a is an example of a pattern 20 which covers a certain area 21 and the area 21 is filled with a plurality of Gaussian beams 22. Each of the Gaussian beams 22 has the same diameter. In FIG. 2b the shape of the cross section 23 of the Gaussian beam 22 is shown. The beams cover the area 21, as the pattern 20 requires.

Figure 3A:
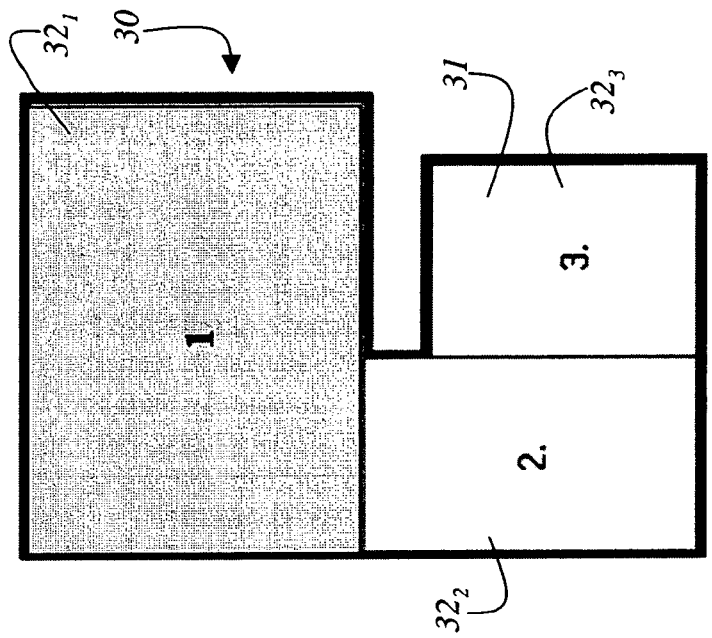
FIG. 3a is an example for a pattern written with a shaped electron beam.
Figure 3B:
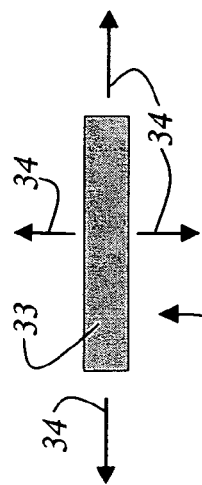
FIG. 3b is the shape of the cross section of the shaped electron beam, wherein the shape dimension can be adjusted according to the pattern which needs to be written.

FIG. 3a shows an example of a pattern 30 which is written with a shaped beam 32. The total area 31 of the pattern 30 is covered by a plurality of various shapes. The various shapes fill the area of the pattern 31. In the present case the area 31 is covered by three different shapes $32_1$, $32_2$, $32_3$ of the electron beam. FIG. 3b shows the shape of the cross section 33 of the shaped beam 32, wherein the shape of the beam can be adjusted according to the pattern which needs to be written. As shown in FIG. 3b, the shape of the beam can be changed. This is indicated by the arrows 34.

In both cases (Gaussian beam and shaped beam) the submicron features of the pattern become the crucial factor for mask-writing and direct writing. With this pattern size. e-beam lithographic systems are confronted with common parasite electron scattering effects, which cause unwanted exposure depositions in the area surrounding the pattern. This parasite electron scattering effects are known as proximity effects (see for example: T. H. P. Chang, "Proximity effect in electron beam lithography," J. Vac. Sci. Technol. 12 (1975) p. 1271). When the minimum feature size becomes less than the backscattered range of electrons, pattern coverage affects the dimensional control of the pattern to be written. On the other hand, forward scattering limits the maximum resolution. The difference between backscattering and forward scattering increases as the energy of the electrons increases. Any pattern detail, which falls within a specific area, suffers significant distortions from its originally designed size and shape in the resulting lithographic pattern image. To maximally avoid pattern degradations/distortions of submicron features it is necessary to apply a correction method for this effect.

FIG. 4a shows simulated trajectories 42 for one hundred electrons scattered in a Poly-Methyl-MethAcrylate layer 40 (PMMA), which defines a resist, coated on a GaAs substrate 41. The primary energy of the electrons is set to 15 keV. As the e-beam 43 impinges on the PMMA-layer the electrons are scattered and move according to the calculated trajectories. FIG. 4b shows simulated trajectories for 100 electrons scattered in the PMMA-layer 40 coated on a GaAs substrate 41, wherein the primary energy of the electrons is higher as in the calculation shown in FIG. 4a. In electron beam lithography the dominant distortion originates from the interaction of electrons with the resist/substrate system convoluted with additional effects, which are not exactly separable and separately treatable. Here the major role plays the absorbed energy density distribution (AEDD) spread in the resist with the corresponding radiation-chemical event distribution in the resist volume creating the latent image (resist differentiation) in the resist. A modeling of the AEDD in the resist layer is possible by using statistical (Monte Carlo) or analytical (Transport Equation) calculations of electron-scattering processes. The real latent image is then created by local chemical modifications of the irradiated resist volume after absorbing a necessary radiation amount from the exposure.

Figure 5:
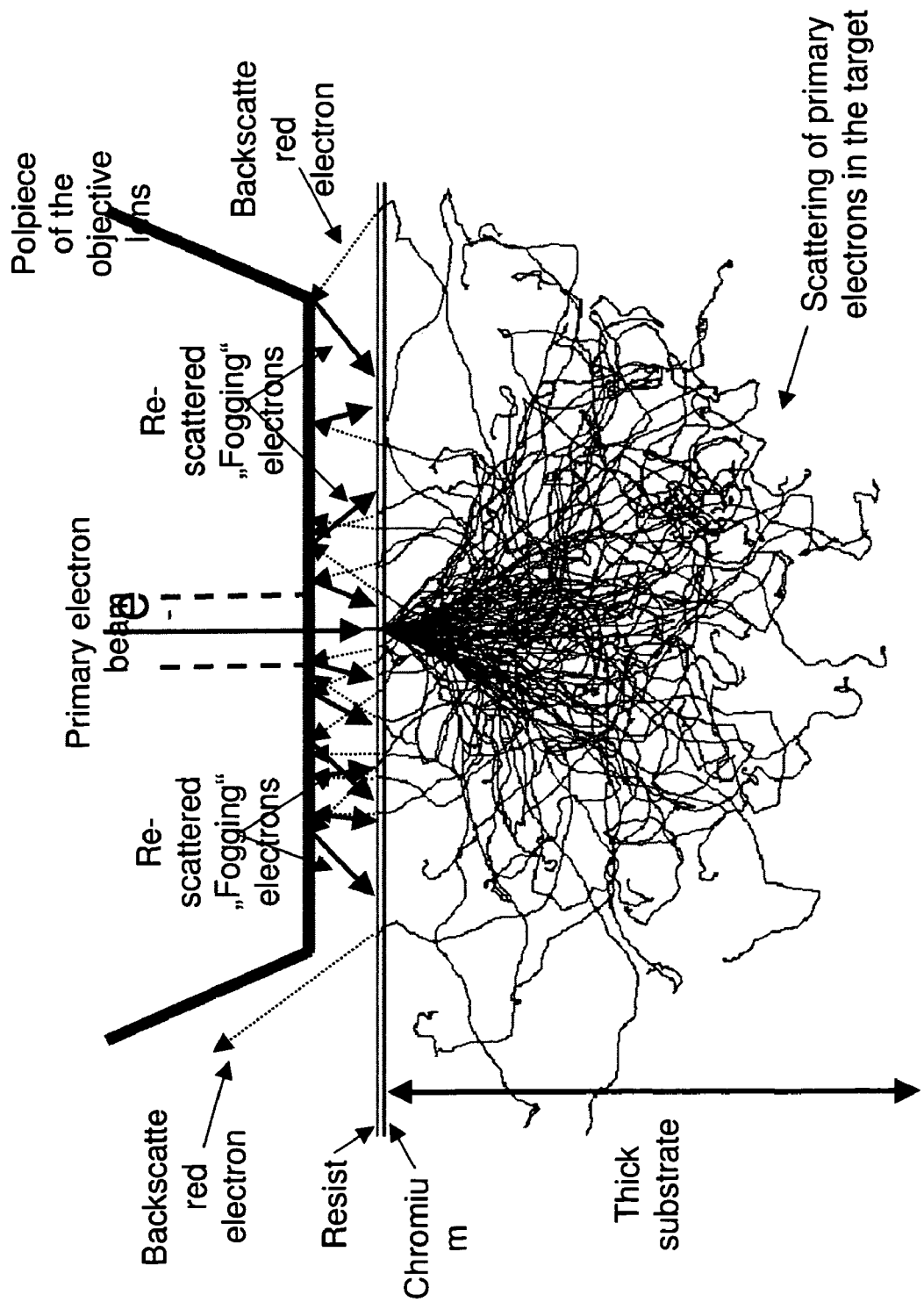
FIG. 5 is a schematics showing the electron scattering in the target and the fogging effect.

FIG. 5 shows the fogging effect as a multiple scattered background exposure (re-scattering), which is generated by the long range effect of the background exposure and dependent on tool construction also.

Figure 6:
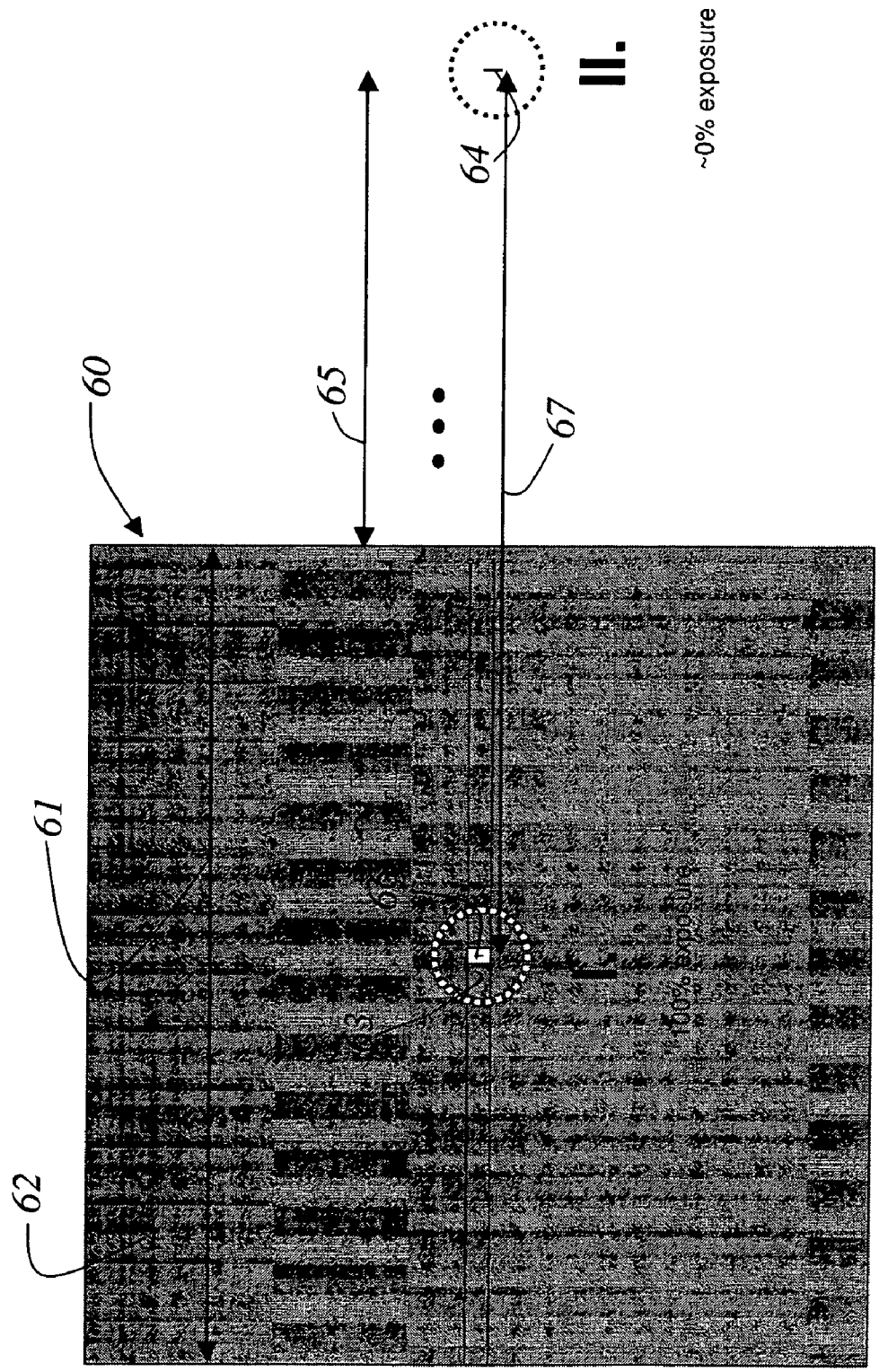
FIG. 6 is a schematic view of a-test pattern with—(I.) and without (II.) fogging impact which explains the fogging effect on the CD changes of specific structures (here a 200 nm wide single-line)

FIG. 6 is a schematic view of the form of a simple experimental test pattern 60 used to explain the fogging effect in "worst case" at nearly 100% pattern load around the pattern under investigation on the dimension of specific structures. The test pattern comprises a full-exposed area 62 with a width 61 of approximately 70,000 µm. Within the exposed area an island 63 is not exposed except an exposed line 66 in the middle of the island 63. A clear line 64, of a width of 200 nm, is exposed at a distance 65 of 60,000 µm from the exposed area 62. The clear line 64 is parallel to the exposed line 66 in the middle of the island 63. The clear line 64 and the exposed line 66 in the middle of the island 63 are separated by a distance 67 of 95,000 µm. Both lines 64 an 66 are exposed under the same conditions (the same intensities—optimal for an isolated 200 nm line not influenced by fogging effect). Measurements and calculations show that the width of the clear line 64 separated by 60,000 µm from the exposed area 62 is not affected by any fogging effect.

Figure 7:
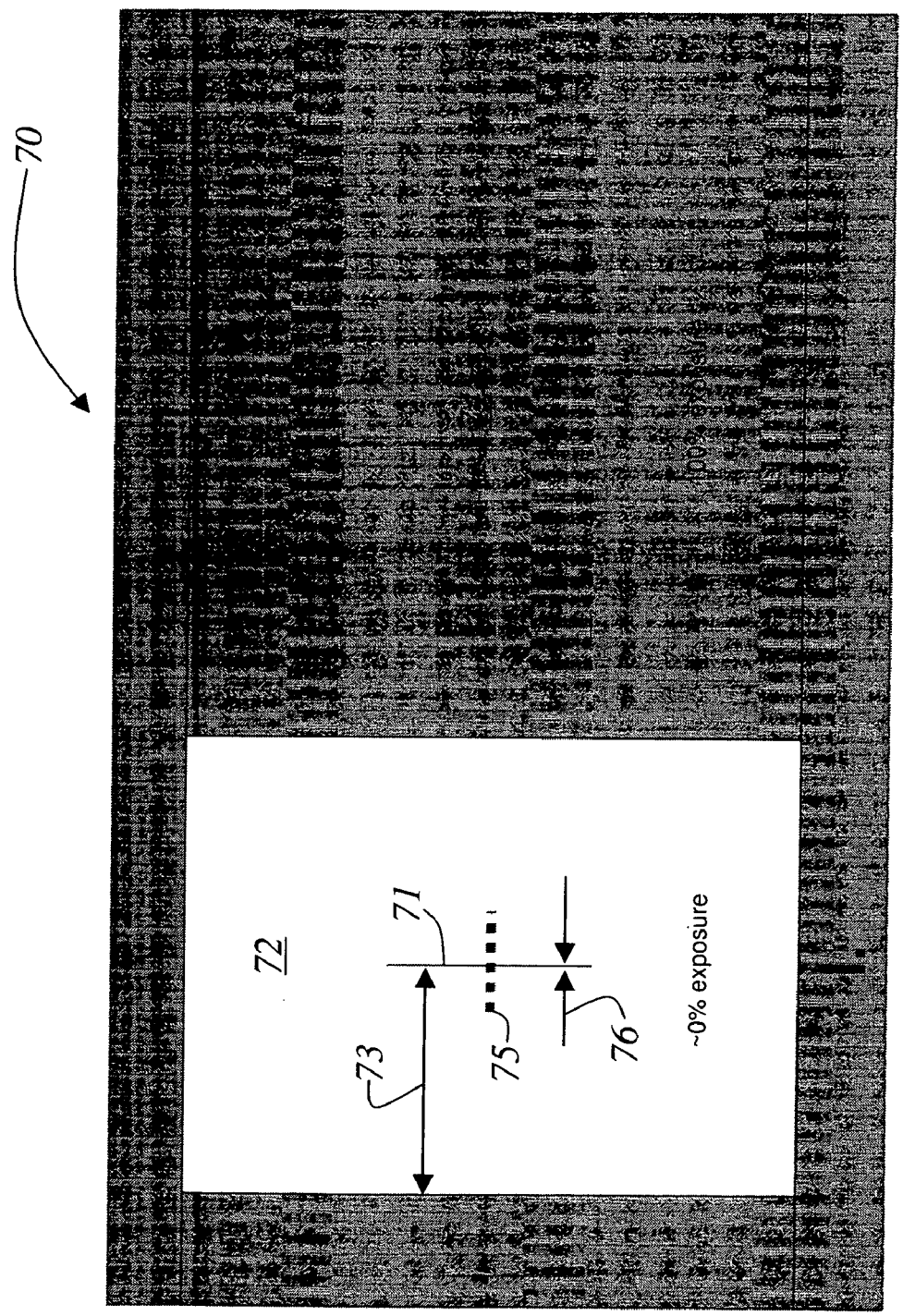
FIG. 7 is a schematic enlarged view of the form of the line pattern (I.) from FIG. 6 used to demonstrate the fogging effect on the dimension variation of specific structures.
Figure 8:
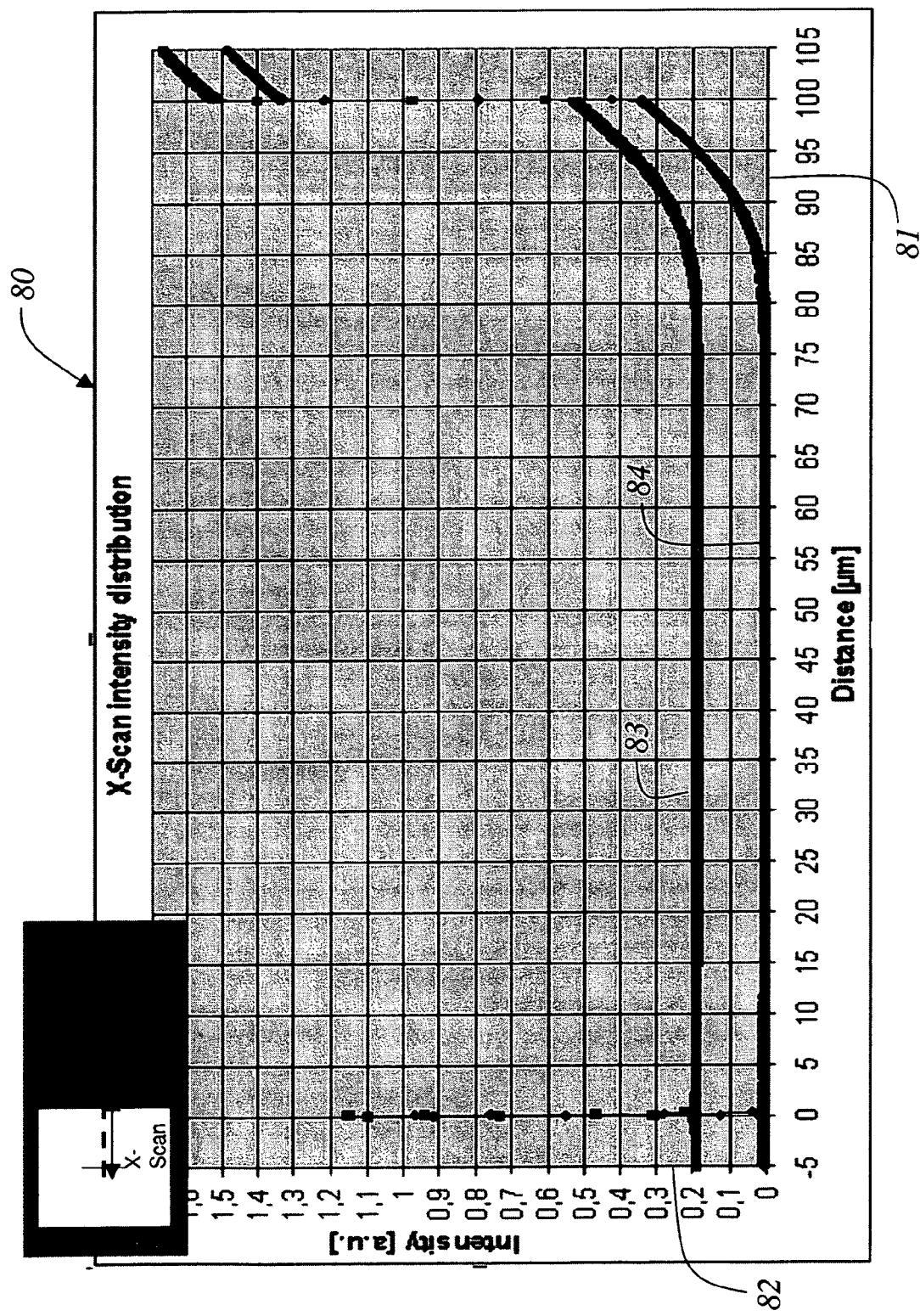
FIG. 8 is a diagram showing the difference of the exposure intensity distributions (calculated in a representative resist depth) in arbitrary units along across the 200 nm exposed single line (I.) in FIG. 6 through the unexposed neighborhood area and extends to one edge of the exposed large fogging area exposed around the calculated line pattern without- and with fogging impact consideration.

FIG. 7 is a schematic view of the form of a second test pattern 70 used to determine the fogging effect on the dimension of specific structures. A single line 71 is exposed within an unexposed area 72. The distance 73 of the single line 71 from the borders of the unexposed area 72 is 100 µm. The exposed width 76 of the line 71 is 200 nm. The unexposed area 72 is surrounded by a large exposed area 74. A measurement and calculation scan 75 of the dose is carried out perpendicular to the exposed single line 71. FIG. 8 shows a diagram 80 showing the calculated absorbed exposure intensity in the representative resist depth in arbitrary units across a line which is perpendicular to the exposed single line 71 and extends to one edge of the exposed area 74 of the second test pattern 70. The abscissa 81 of the diagram 80 represents the position along the line which is in the direction of the X-coordinate. The ordinate 82 shows the absorbed exposure intensity at the respective position in arbitrary units. The first curve 83 of the diagram 80 shows the measured dose with fogging effect and the second curve 84 shows the measured dose without the fogging effect. The fogging effect causes the first curve 83 to have a higher intensity level than the second curve.

Figure 9:
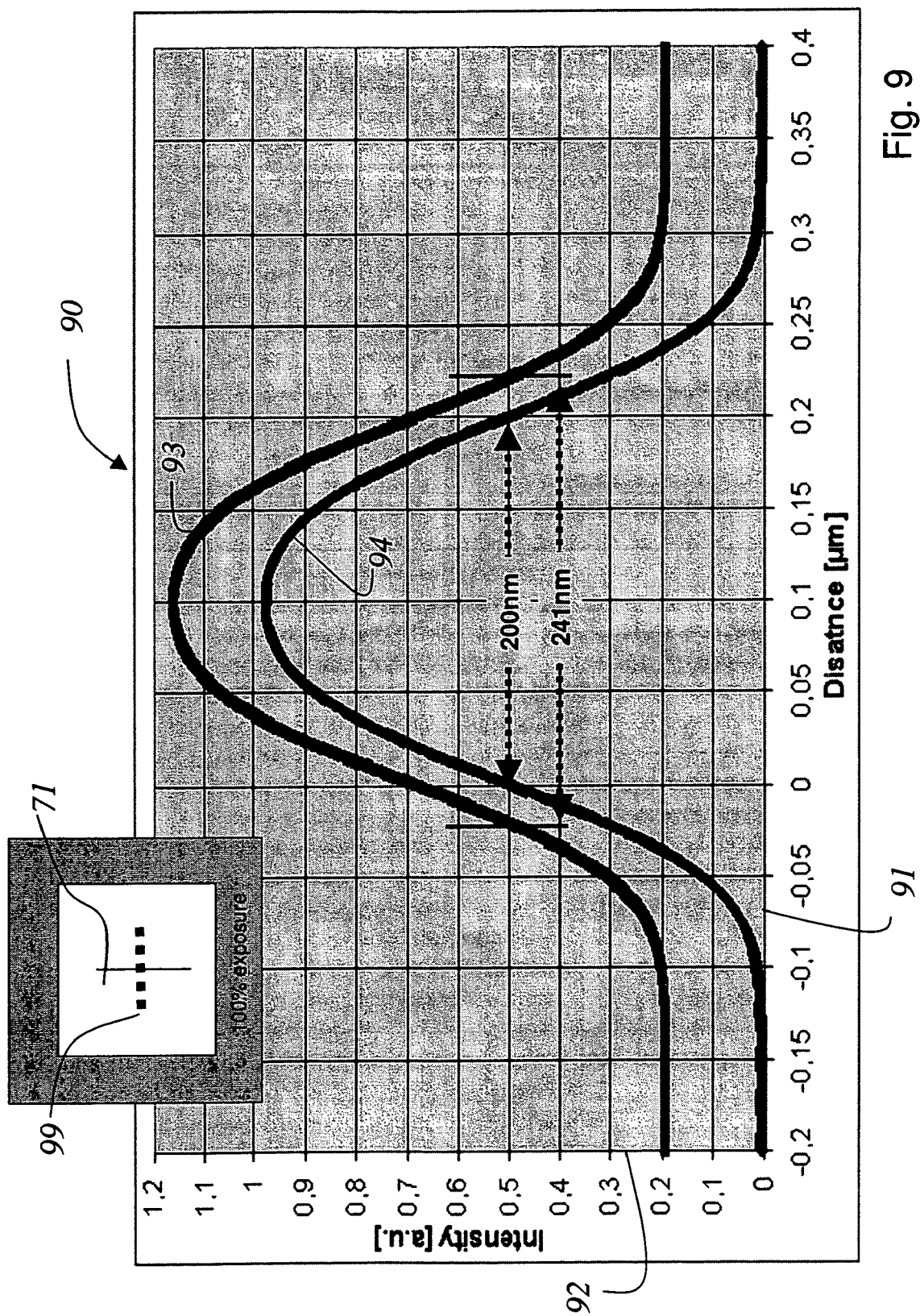
FIG. 9 is an enlarged diagram from FIG. 8 showing the difference between the calculated exposure intensity distributions and the resulting CD in arbitrary units for the 200 nm designed single line (I.) from FIG. 6 perpendicular to the exposed line and extends 200 nm to the left and to the right of the exposed line without- and with fogging impact consideration.

FIG. 9 shows a diagram 90 showing the calculated absorbed exposure intensity in the representative resist depth in arbitrary units (relative intensity) across a line 99 which is perpendicular to the exposed single line 71 and extends 200 nm to the left and to the right of the exposed single line 71. The abscissa 91 of the diagram 90 represents the position along the line 99 which is in the direction of the X-coordinate. The ordinate 92 shows the intensity at the respective position in arbitrary units. The first curve 93 of the diagram 90 shows the exposure intensity with fogging effect and the second curve 94 shows the exposure intensity without the fogging effect. As shown in FIG. 8, the fogging effect causes the first curve 93 to have a higher intensity level than the second curve 94. With the second test pattern 70 it is the intention to expose a line and obtain a resulting width 96 of 200 nm. Without the fogging effect this goal is achieved. Taking the fogging effect into account the resulting width of the line would be 241 nm. The increased width 95 is caused by the additional dose contributed to the exposure by the fogging effect.

Figure 9A:
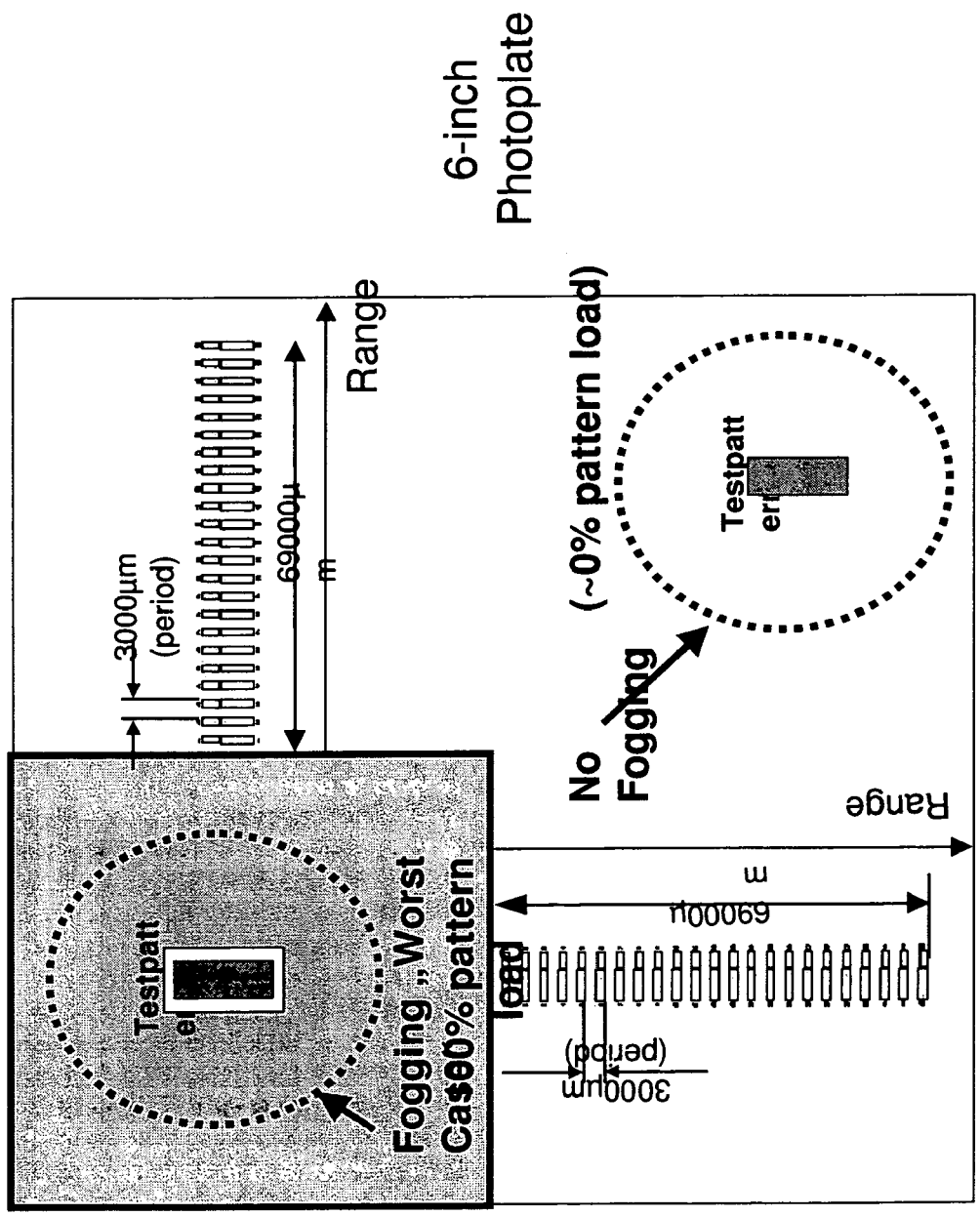
FIG. 9a test layout used for the determination of the fogging parameters consisting of test structures exposed without and with fogging impact. Examples of test structures to be used are described in FIGS. 10 and 11.

FIG. 9a shows a test layout used for the determination of the fogging parameters consisting of test structures exposed without and with fogging impact. Examples of test structures to be used are described in FIGS. 10 and 11.

Figure 10:
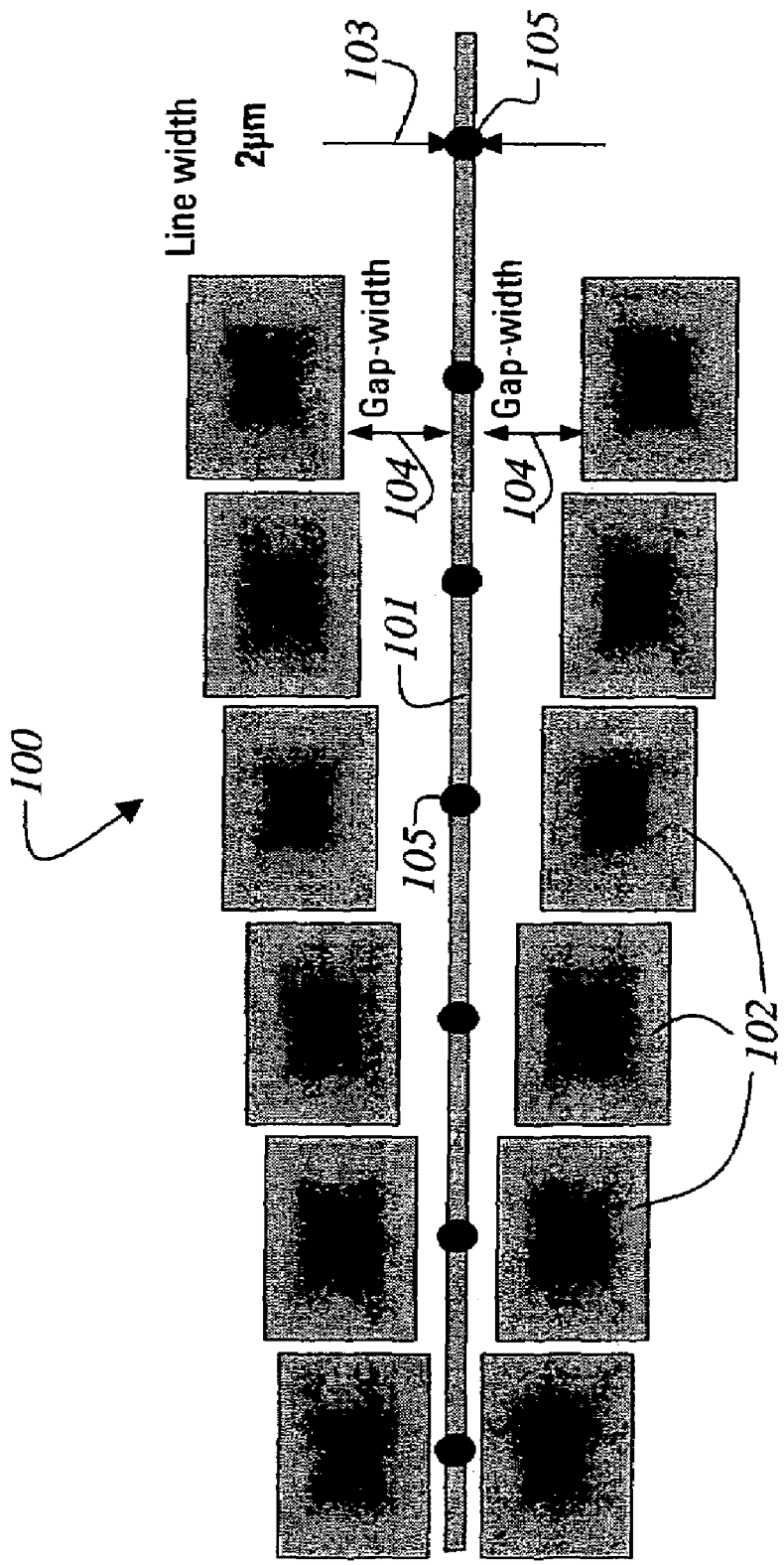
FIG. 10 shows the line in "Pyramid" test "PYR" pattern which is exposed.

Besides the fogging effect, which is a long range effect, the proximity effect, which is a short range effect, needs to be considered as well. One option to consider the proximity effect is described below. FIG. 10 shows a first possible (already implemented in PROX-In) test pattern 100 which is written into the resist. The procedure to back-simulate this first test pattern 100 is named pyramid "PYR" (uses a pyramid-like test pattern 100). This special process can be initiated by the user via the PROX-In user interface (see FIG. 12). The procedure allows to determine the input parameters after analyzing the experimentally measured data from line width variation of the exposed symmetrical pyramid test pattern 100. The first test pattern 100 contains one line 101, which has a predefined line width 103. On both sides of the predefined line 101 large pads 102 are exposed with a varying gap width 104 along the measured line 101. In the non-corrected case the predefined single clear line width 103 increases with decreasing gap width 104 between measured line 101 and large pads 102. The measurement is taken at locations which are marked with points 105 in FIG. 10.

Figure 11:
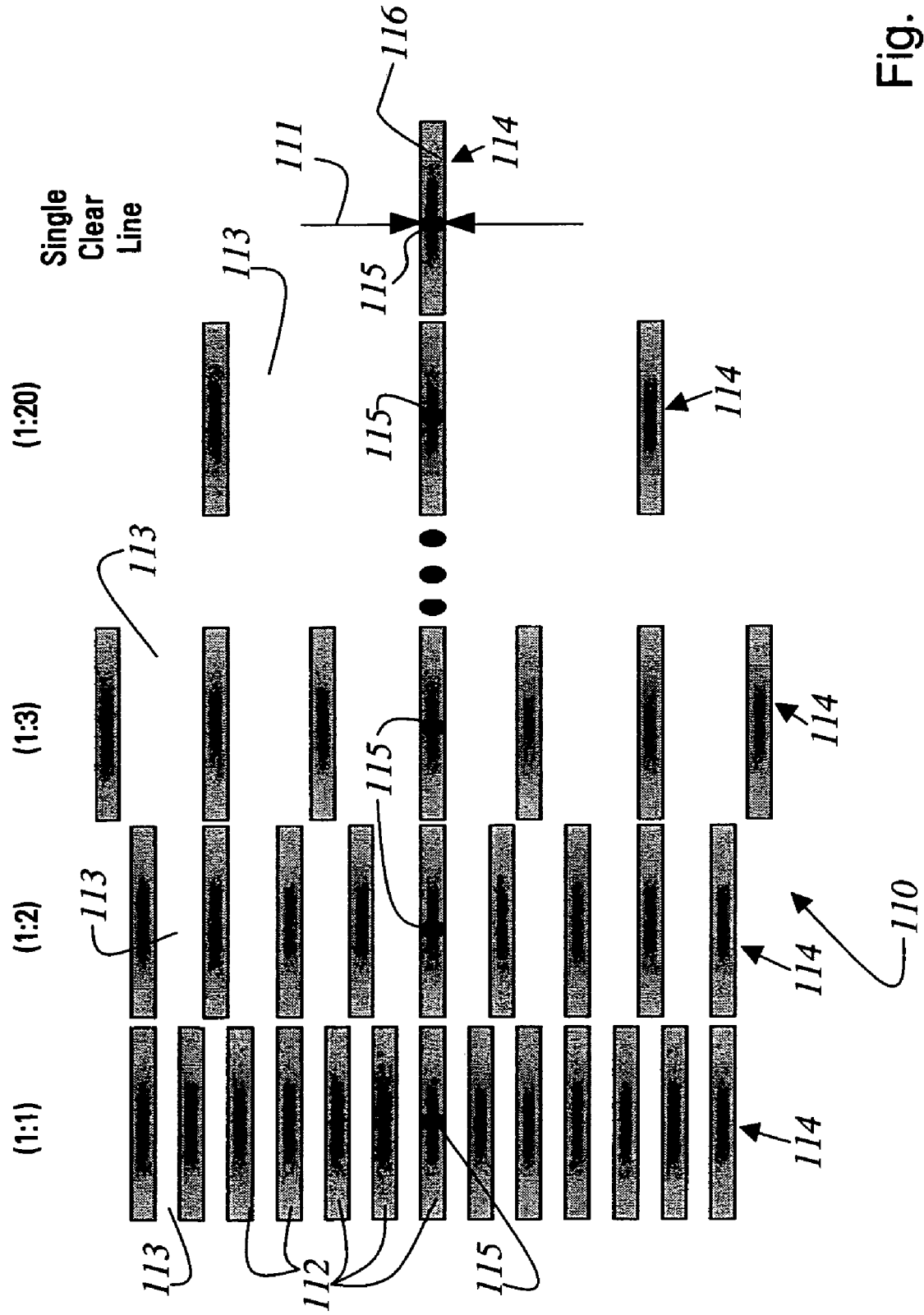
FIG. 11 shows the line in Duty-Ratio Test "DRT" pattern which is exposed.

FIG. 11 shows a second possible test pattern 110 also already implemented in PROX-in which can be used for the direct proximity parameter determination. Similar to the other previously described method, this procedure is based on line width 111 measurements of exposed non corrected Duty-Ratio-Test patterns "DRT ". A plurality of lines 112 are exposed in the resist and/or further processed. The lines 112 are created in arrays 114 of various pitches 113 between the lines. This special process can be initiated by the user via a special PROX-In user interface (see FIG. 14). The procedure allows to determine the proximity input parameters after analyzing the experimentally measured data from representative line 115 width variation of the exposed symmetrical second test pattern 110. To receive the acquired file (see FIG. 15). data in two columns in the form are provided. The first column 151 is the Duty-Ratio parameter as a number 1, 2, 3 . . . 20 of the ratio (1:1, 1:2, 1:3 . . . 1:20). The second column 152 is the measured line width to the appropriate ratio in µm. The third column 153 is the calculated line width. It is necessary to measure the variation of the line width somewhere from the middle of each array 114 for various Line/Space rates. Bullet points 115 in FIG. 11 indicate the locations where the measurements are taken. It is important that before starting the "DRT" measurement procedure it is necessary to determine the optimum exposure dose for the single-clear-line 116 on the right side of the second test pattern 110. In other words, the measured single clear line has the line width as required by the CAD-data and the patterned line meets the target as well as possible.

Figure 13:
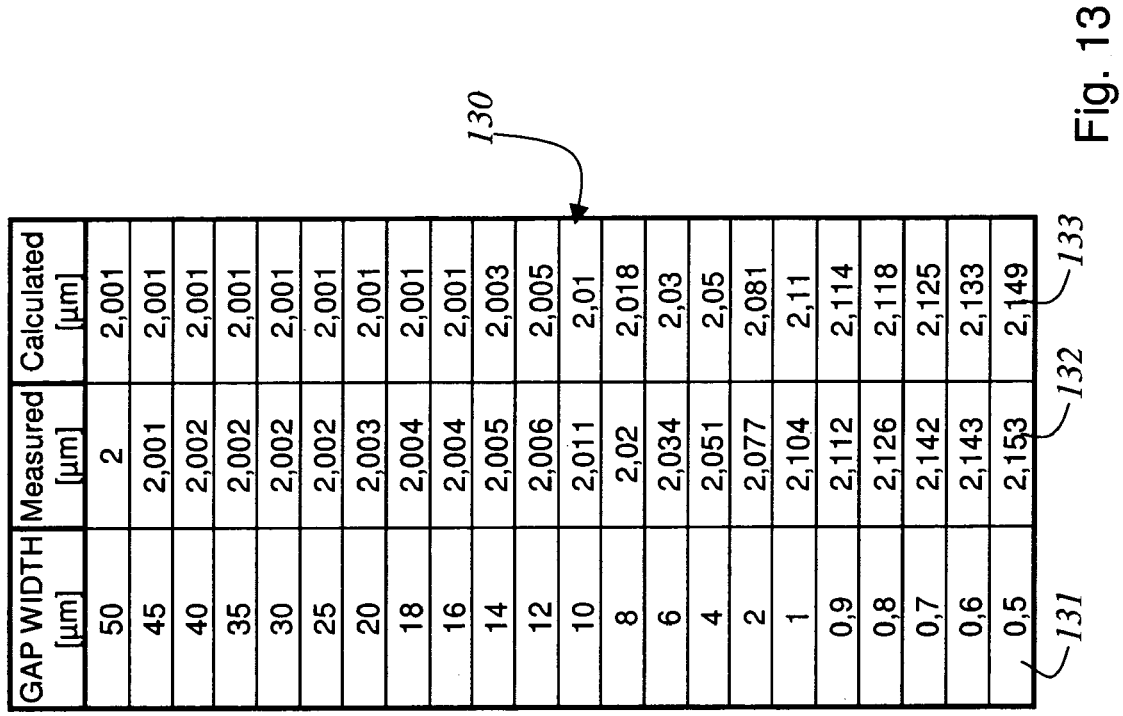
FIG. 13 shows a table of measurement and calculated results gained from the exposed pattern as shown in FIG. 10.
Figure 12:
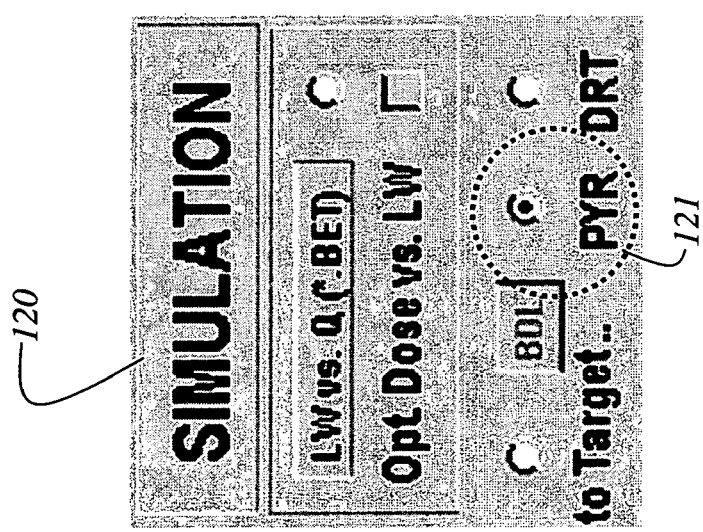
FIG. 12 shows an input window for the user to initiate the exposure of the test pattern as shown in FIG. 10.
Figure 13A:
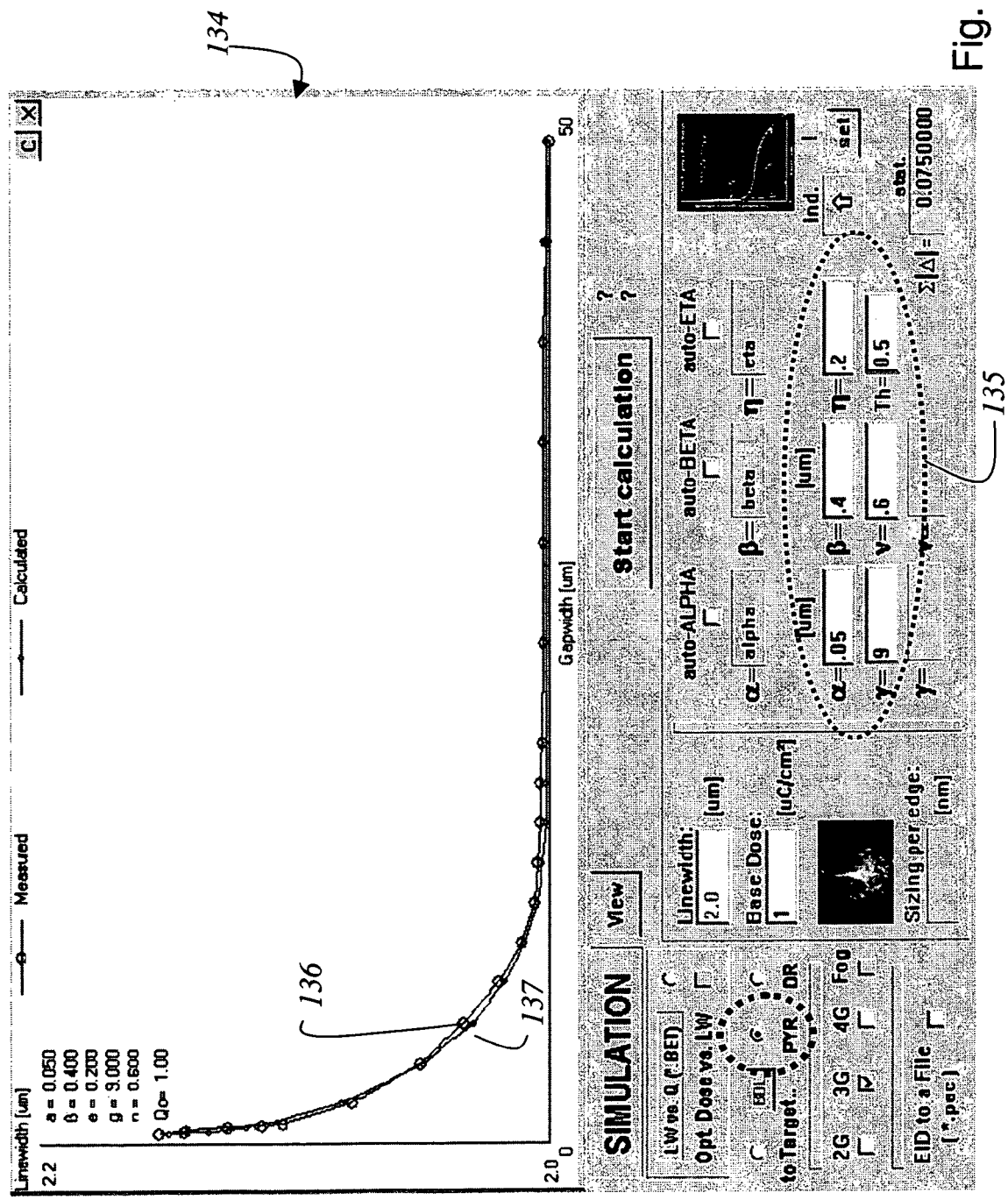
FIG. 13a shows the result gained from the exposed test pattern as shown in FIG. 10 after back-simulation with optimized input parameters.

FIG. 12 shows an input window 120 for the user to initiate the exposure of the first test pattern 100 as shown in FIG. 10. The user selects the pyramid procedure by setting a mark (check the "PYR" button) 121 above the indicated "PYR" name and the back-simulation procedure starts. The result is shown in a table 130 (see FIG. 13). The measurement result, gained from the exposed first pyramid test pattern 100 is shown in the second (middle) column 132. The first column 131 shows the gap width and the third column 133 shows the from simulation back-simulated/reconstructed/calculated line width 133 for the given determined input parameter set. FIG. 13a shows the result in a graph form 134 from PROX-In, where the goal is to find such a parameter set 135, which provides the best coincidence of measured data 136 with calculated ones 137.

Figures 14, 15:
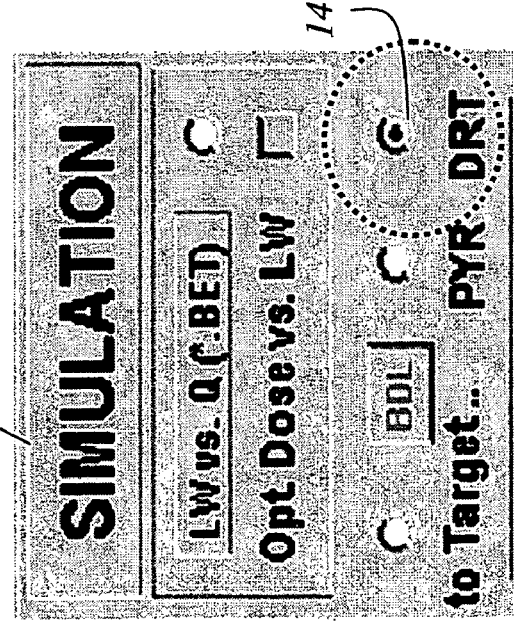
FIG. 14 shows an PROX-In input window for the user to initiate the procedure of the "DRT" test pattern.
FIG. 15 shows a table of measurement and calculated results gained from the exposed and back-simulated "DRT" pattern.

FIG. 14 shows an PROX-In input window 140 for the user to initiate the procedure of the second "DRT" test pattern 110 as shown in FIG. 11. The user selects the Duty-Ratio-Test procedure by setting a mark 141 above the indicated "DRT" name (check the "DRT" button) and the calculation process starts. The results are shown in table 150 (see FIG. 15). The measurement results, gained from the exposed second test pattern 110 are shown in three columns. The first column 151 contains the Duty-Ratio, the second column 152 contains the measured line widths and the third column 153 contains the calculated line widths from the back simulation.

Figure 15A:
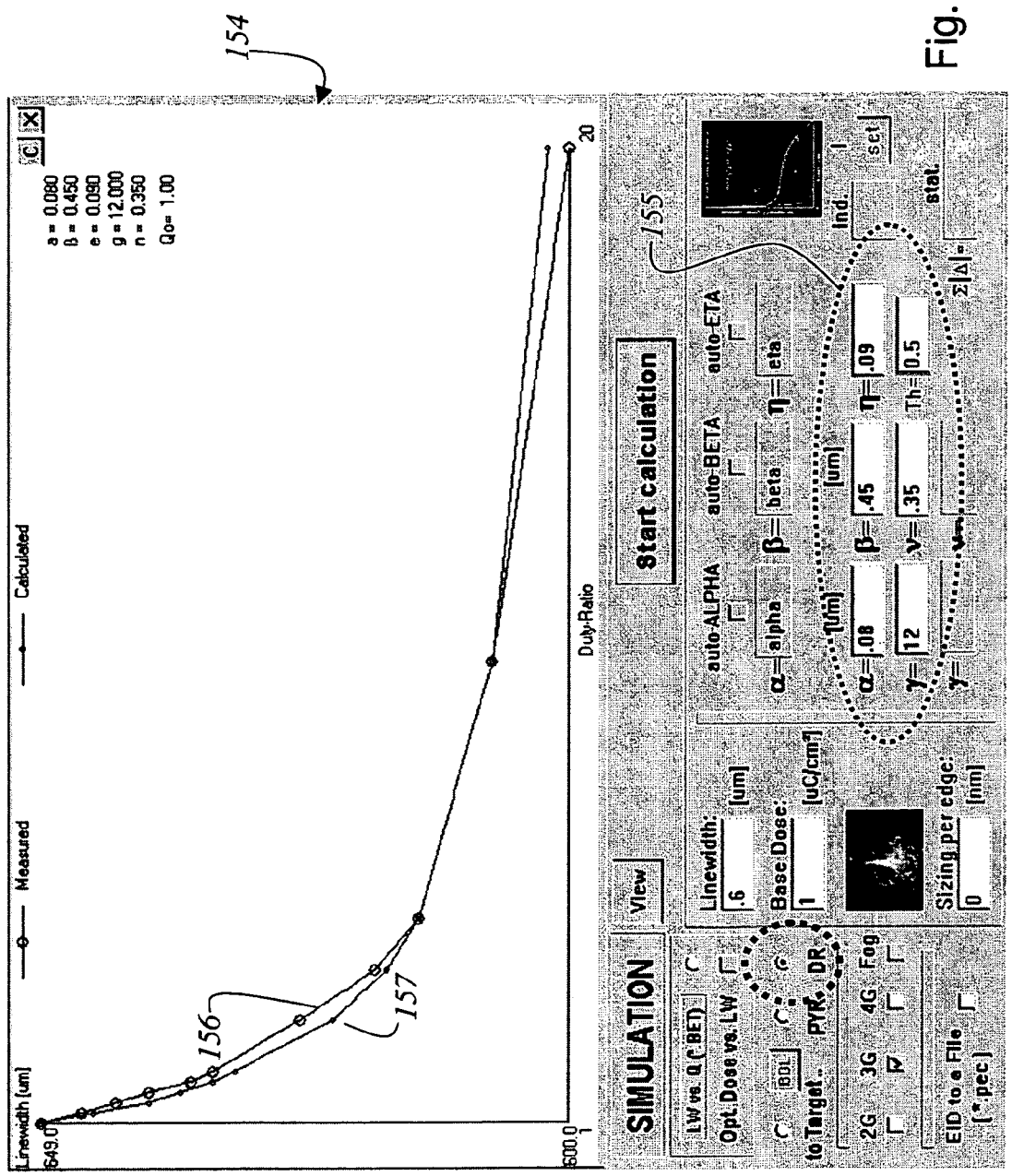
FIG. 15a shows the comparison of measured and calculated results in a graph form from PROX-In after back-simulation of the "DRT" pattern with optimized input parameters.

FIG. 15a shows the result in a graph form 154 from PROX-In, where the goal is (also the same as in the previous case with the pyramid-pattern) to find such a parameter set 155, which provides the best coincidence of measured data 156 with calculated ones 157.

It is obvious that other test patterns may be designed and used in order to gain additional experimental and simulated data to which the determined proximity parameters have to be cross checked and fitted. The fit provides a parameter set which allows exposure of a couple of micro-patterns and the result gained is highly conformant with the provided design data for the required pattern. In other words: any pattern exposed with the process according to the present invention results in patterns which have dimensions as required according to the design data. In addition to the proximity effect correction the correction with regard to the fogging effect has to be provided.

Figure 16:
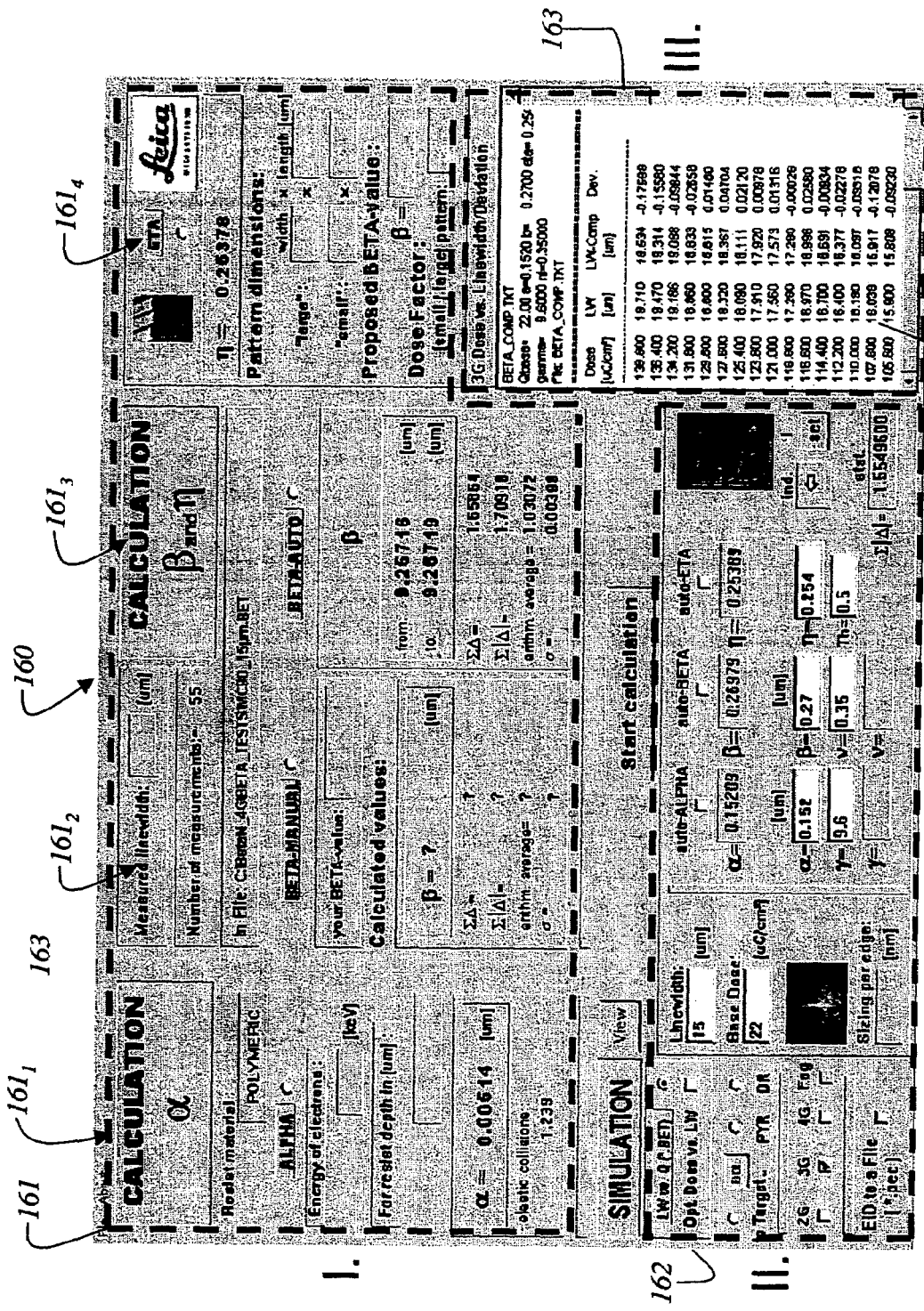
FIG. 16 shows the main window of the program PROX-In provided on the display associated with the computer.

The PROX-In and the correction with respect to the fogging effect run on a standard computer. The computer runs under Windows and does not need any specific hardware/software features. The general structure of PROX-In plus the fogging correction is clear from the main window 160 shown on a display 17. The main window appears immediately after starting the program PROX-In (See FIG. 16). The main window 160 is divided into three main parts. The first part 161 is in the whole upper half of the main window 160. The first part has headings "CALCULATION $\alpha$" and "CALCULATION $\beta$ and $\eta$". The first part 161 consists of a first, second, third, and fourth separate sub-boxes $161_1$, $161_2$, $161_3$ and $161_4$ . The first sub-box $161_1$ has a heading "ALPHA". The second sub-box $161_2$ has a heading "BETA-MANUAL". The third sub-box $161_3$ has a heading "BETA-AUTO". The fourth sub-box $161_4$ has a heading "ETA". The sub-boxes serve for the quick first evaluation of the lithographic process response from measurements of relatively large patterns/wide lines and provide the first (rough) numerical approach for the proximity parameters.

The second part 162 is poisoned at the bottom of the main window 160. The second part 162 is headed as "SIMULATION" and serves for the final "fine-tuning" of the parameters based on the best pattern reconstruction using back-simulation.

The third part 163 is located in the right-bottom side of the main window 160. The third part 163 is a scrolled "Input/Output" MEMO-box with a text window 164, where some necessary information resulting from the selected operations/calculations is shown.

New e-beam lithographic systems are designed to satisfy the CD-requirements at 100 nm device generation level and below. To meet these specifications it is necessary to have an adequate knowledge base covering all pattern-degradation/distortion effects through the whole process and also the consecutive application of the accurate correction methods.

The proximity correction control function f(r) is usually described as a sum of two or more Gaussian functions (see Equation. 1). The function type is chosen in accordance to the Kernel type used in the proximity corrector.

In the case of a normalized 2G-function it reads as follows:

$$f(r) = \frac{1}{\pi(1+\eta)} \left\{ \frac{1}{\alpha^2} \exp\left(-\frac{r^2}{\alpha^2}\right) + \frac{\eta}{\beta^2} \exp\left(-\frac{r^2}{\beta^2}\right) \right\} \quad \text{Equation 1}$$

where the first term α—characterizes the short-range of forward scattering, the second term β—the backscattering, the parameter η—is the deposited energy ratio of the backscattering component to the forward scattering component, and r—is a distance from a point of electron incidence (see FIG. 4a).

The correction of the fogging effect (long range) can be carried out for example with at least one Gaussian function $G_{fog}$, which describes the fogging correction control function:

$$f_{fog}(r) = c_{fog} G_{fog} \quad \text{Equation 2}$$

Additionally, the correction of the proximity effect (short range) and the fogging effect (long range) is achieved by applying the proximity correction control function f(r) and the fogging correction control function $f_{fog}(r)$ simultaneously. It should be noted once again that application of the above described proximity correction control function is only one option of many available.

According to the present embodiment the overall control function is:

$$PF(r) = c_1 G_1(r) + c_2 G_2(r) + \ldots + c_{fog} G_{fog}(r) \quad \text{Equation 3}$$

In a particular embodiment, the common proximity and fogging control function PF(r) is determined by:

$$PF(r) = c_f G_f(r) + c_b G_b(r) + c_{fog} G_{fog}(r)$$

wherein a first term with index f characterizes the short-range of forward scattering correction by a Gaussian function $G_f(r)$ multiplied with factor $C_f$, a second term with index b—the backscattering correction by a Gaussian function $G_b(r)$ multiplied with factor $c_f$, and a third term with index fog determines a Gaussian control function $G_{fog}(r)$ determines a control function for the fogging effect, and wherein r is the distance from the point of electron incidence.

The final resist-relief mask is obtained after the application of a post-exposure process (mostly a wet process) in a suitable developer. For the modeling and prediction of the real resist pattern geometry, the dissolution behavior of the polymer modified by radiation needs be exactly known. The development process brings into the whole simulation a large amount of uncertainties, because of the highly non-linear behavior of this complicated thermo-hydro-kinetic process. Since a large variety of systems (semiconductor substrate, resist and post exposure process) exist, the parameters of equation 2 need to be determined for all the different systems.

In mask making a similar complication also appears during the second step—the pattern-transfer into the imaging layer and/or substrate through the resist in both wet and/or dry etching.

The correction of proximity effects in the field of e-beam lithographic systems, is available by some commercial software packages that all deal with exposure dose optimization issues based on the principle of using double or multiple Gaussian approximations of the electron-scattering phenomena as described above. If the input parameters are determined from Monte Carlo simulation exclusively, then the calculations involve only the pure AEDD. Such results do not contain any information about additional non-linear effects from other influencing elements. One influencing element is the process, for example radiation-chemical events in the resist, thermal effects, dissolution behavior in development and etching in mask making. An other influencing element is the tool, (for example, electron-optical aberrations and space charge effects affecting the aerial image slope and/or edge acuity), dependent impacts affecting the resulting pattern deformation. On this account the inputs for correction schemes should be estimated by using physical behavioral models, which exactly describe all these effects and, in addition, even finely tune the values of these parameters obtained from experimental measurements.

The exact determination of fogging parameters using physical models is practically not possible. The fogging intensity can be roughly predefined from the pattern density-map over the whole exposure area of the substrate. The generation of fogging electrons is highly tool (construction) dependent. Also the number and energy spectra of fogging electrons is unpredictable and the trajectory- and energy-spread of this electrons can also not be exactly calculated and predetermined. Therefore, the resulting exposure efficiency of fogging is not exactly known and the only one possibility how to get the necessary quantitative values for the correction is to use experimental methods. The fogging effect parameters are also highly dependent on the lithographic process (contrast) and generally in case of "good" processes the needed fogging-correction band is very narrow (typically, in the "worst case" for 10-40 nm CD-fogging-variation is only max. 0.75-1.5 µC/cm² dose correction needed, i.e. pattern inside a mask region with nearly 100% pattern load). Consequently, a small deviation/uncertainty of the determined correction parameters from the optimum can result in strong under- or over-correction and therefore in a loss of global CD-uniformity.

For the correction process only properly selected numerical inputs can bring the correction system to work. Therefore great efforts have been taken to develop a quick and easy method for the numerical determination of process-depending input parameter sets required to determine the exposure control function. The flexible program package PROX-In should help the lithographer to find/determine these optimized numerical values. The present invention uses a semi-phenomenological concept.

Special care was taken to synchronize both the algorithms of the corrector and the PROX-In software, respectively, to obtain the same results in the simulation mode for identical input parameters.

The proximity correction together with the fogging correction with the e-beam lithographic system 1 reduces the dimensional errors to <10 nm on masks and wafers for the 100 nm device generation and below.

Before starting "PROX-In", it is unavoidable to extract the following main numerical lithographic parameters directly from the set of specifically designed and exposed test patterns (needed as insert/setting parameters for the numerical calculation into PROX-In).

Figure 17B:
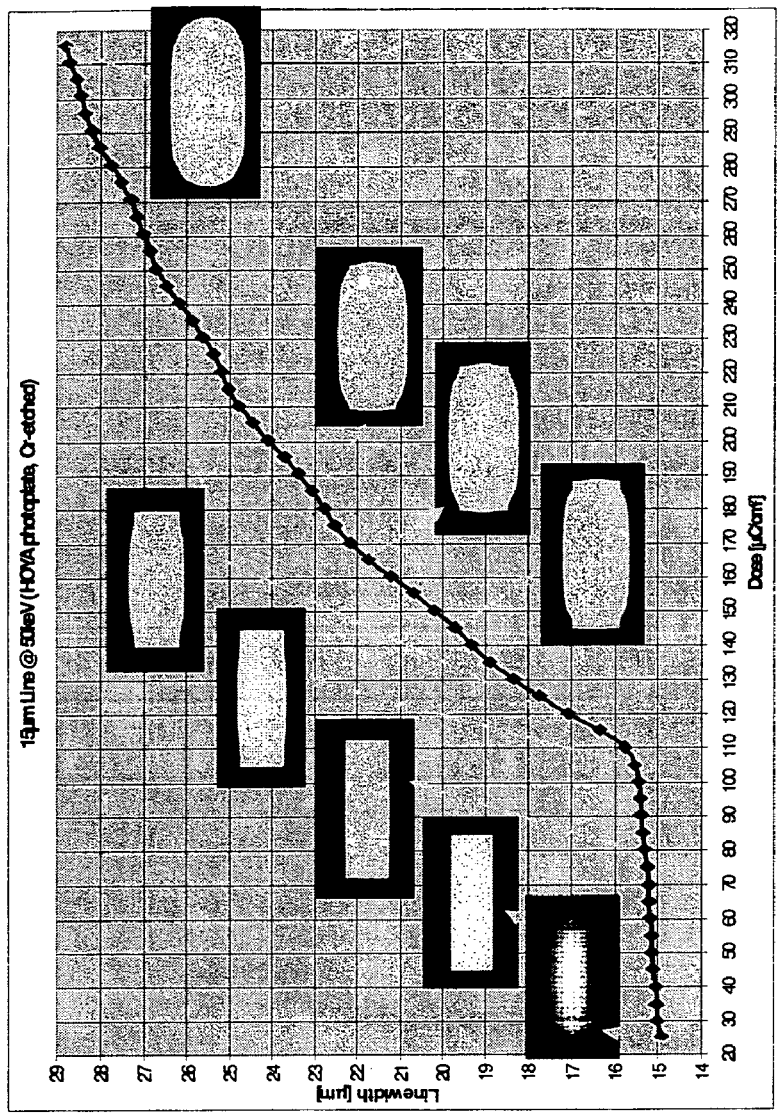
FIG. 17b shows a change in measured line width as a function of the dose exposed.
Figure 17A:
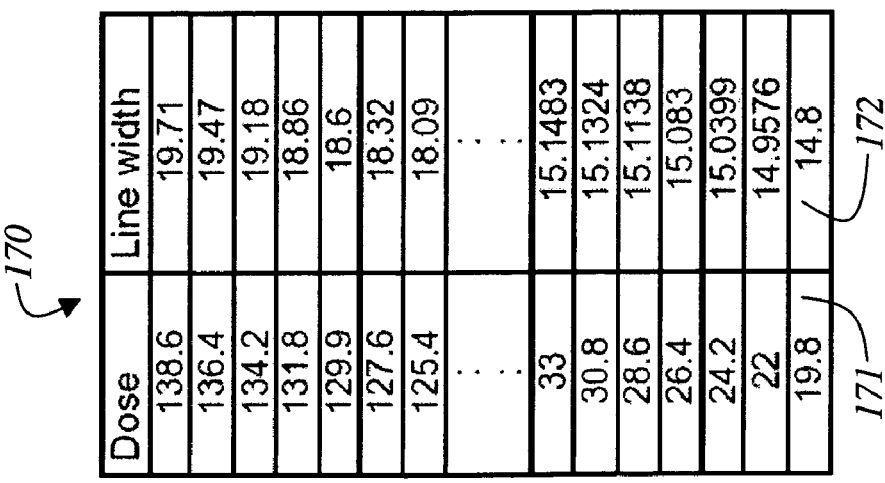
FIG. 17a shows a table of an exposed and measured line width as a function of the applied dose.

FIG. 17a shows a table 170 of the (* .BET)-File, for a preparation wherein the exposure dose [µC/cm²] is displayed vs. the measured line width [µm].

Measurements should be performed on an isolated wide line exposed with various doses without the fogging impact. The result 173 of the measurement is visualized in FIG. 17b. The measured line should be a pattern exposed as a long-isolated line of a width >β (to "collect all backscattering electrons", i.e. for 50 keV mask making ≧10 µm). The (* .BET) file (table 170) is written by using an arbitrary Text-Editor by direct insertion of the measured values as "Dose" [µC/cm²]—Separator—"Linewidth" [µm] in two columns 171, 172, descending with dose value in ASCII-format, (see example in FIG. 17a for a 15 μm wide line). The measurement is taken by CD-measurement tools (for example Leica LMS-IPRO, Leica LWM, CD-SEM, or the like).

The method is based on the analysis of the line width variation vs. exposure dose (see FIG. 17b). The dose is written on the abscissa and is increasing (with a fine step) from a smallest reasonable value through the optimum exposure (where the line width meets the target of 15 m up to higher values (to approx. 10× the optimum dose). The measured line width is shown on the ordinate. A visualization of the whole effect of backscattering, together with all additional impacts from pre- and post-exposure processes is shown in FIG. 17b by the resulting line width and/or format. The specific β parameter for the given process configuration can be calculated by inserting the (*.BET)-file into the algorithm working under "BETA-MANUAL" and/or "BETA-AUTO" in the "PROX-In" program.

A second portion 180 of the main window 120 is headed as "SIMULATION" and serves for the "fine-tuning" of the numerical input parameter set on a selected pattern. The parameter tuning is based on "Back-Simulation" of the measured dimensional variations of a pattern depending on the applied dose and/or neighborhoods. One pattern is a wide single clear line. The line width variation versus exposure dose is based on results obtained and the corresponding (*.BET)-file (see FIG. 17a). A further possibility is to determine the nominal dose versus the targeted line width for isolated clear lines for a width-range from minimally resolvable lines up to 2-3 μm (depending on the process). ASCII-data from measurements are gained in the form of line width versus, dose factor from a (*.TGT)-file. The corresponding data can be extracted from measurements of non-corrected exposed test patterns. A "PYR"—pyramid-like pattern-line width variation as a function of the programmed gap-width between the measured line and large, symmetrically exposed, pads along the measured line (see FIG. 10). Measurement data are required in ASCII-format from measurements in the following form: gap width versus line width as (*.PYR)-file. "DRT"—Duty Ratio Test—line width variation as a function of the line/space-pitch—Measurement data are required in ASCII-format from measurements in the following form: Line width versus, pitch as (*.DRT)-file.—Data can be extracted from the measurements on non-corrected test patterns (see FIG. 11). The main task of this simulation part, as displayed in the second portion 180 of the main window 120 is to find (iteratively) a reasonable set of input-parameters for the lithography model used. The simulation shows the best possible fit with measurements. That means, the simulation should reconstruct the real situation of the measured pattern geometry variation.

The main task of this simulation part is to find a reasonable set of input parameters for the proximity correction and fogging correction of a lithography model used, where the simulation shows the best possible fit with measurements. That means, the simulation should reconstruct the real situation of the measured pattern geometry variation.

Before pushing a Start button 181 for a simulation the user has to chose one of the four pattern types ("LW vs. Q", "to Target . . . ", "PYR", "DRT") from which the corresponding ASCII-file is available with measured data. It is also necessary to fill-in all active Edit-Windows 182 with relevant numerical values and select the required model approach using a 2, 3, or 4 Gaussian representation for the proximity effect plus an additional Gaussian function for the fogging effect.

Possible numerical ambiguities (e.g. not only one-value results and/or parameter values without a reasonable physical interpretation) may cause certain complications. Therefore we recommend to generally start the simulation with a "2G" 184 (two Gaussian) approach and as start values insert the β- and η-values obtained from the first rough approximation. As the starting value a number ranging between 0.05-0.1 μm can be set.

Figure 18:
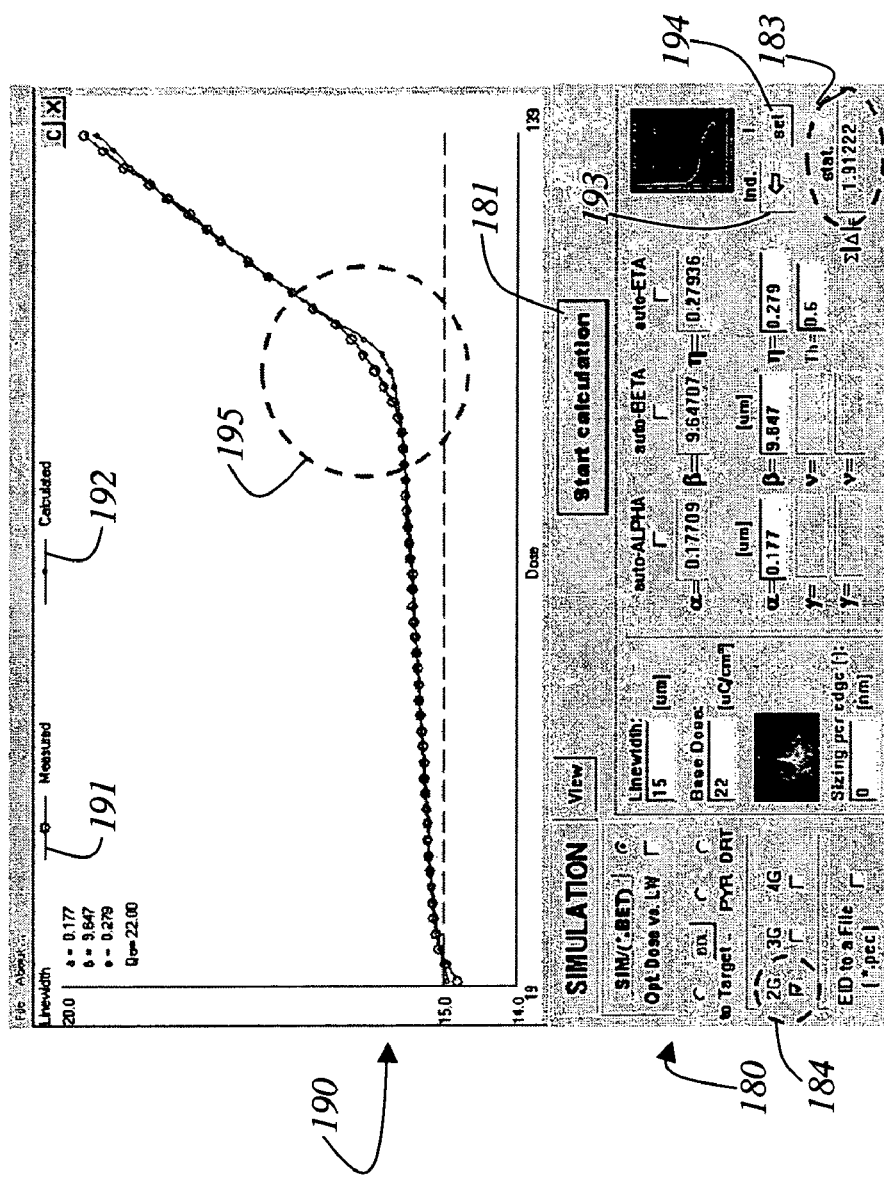
FIG. 18 shows the parameter-determination fitting process to experimental data from FIG. 17a,b using the Back-Simulation method and a 2 Gaussian "2G" approximation.

After starting the simulation a request for the corresponding ASCII-File appears (one of (*.BET), (*.TGT), (*.PYR), or (*.DRT) depending on the selected pattern type). If the file will be successfully read and interpreted by the program a new graphic window 190 (see FIG. 18) appears immediately in the top part of the second portion 180 of the main window 120 showing the results from the measurement 191 and related simulation 192 using the entered values in an appropriate graphic form.

Along with the graphics also a text information appears in the third part 123, located in the right-bottom side, of the main window 120 (see FIG. 12). The third part 123 contains the corresponding numerical comparison between experimental and calculated results with an evaluation of the fit-quality. The data can be directly handled in the third part 123 similarly as in an ordinary editor, i.e. mark the text, copy into clipboard, and also directly insert the copied ASCII-data into other software (e.g. Excel, . . . ) for further treatment.

Figure 19:
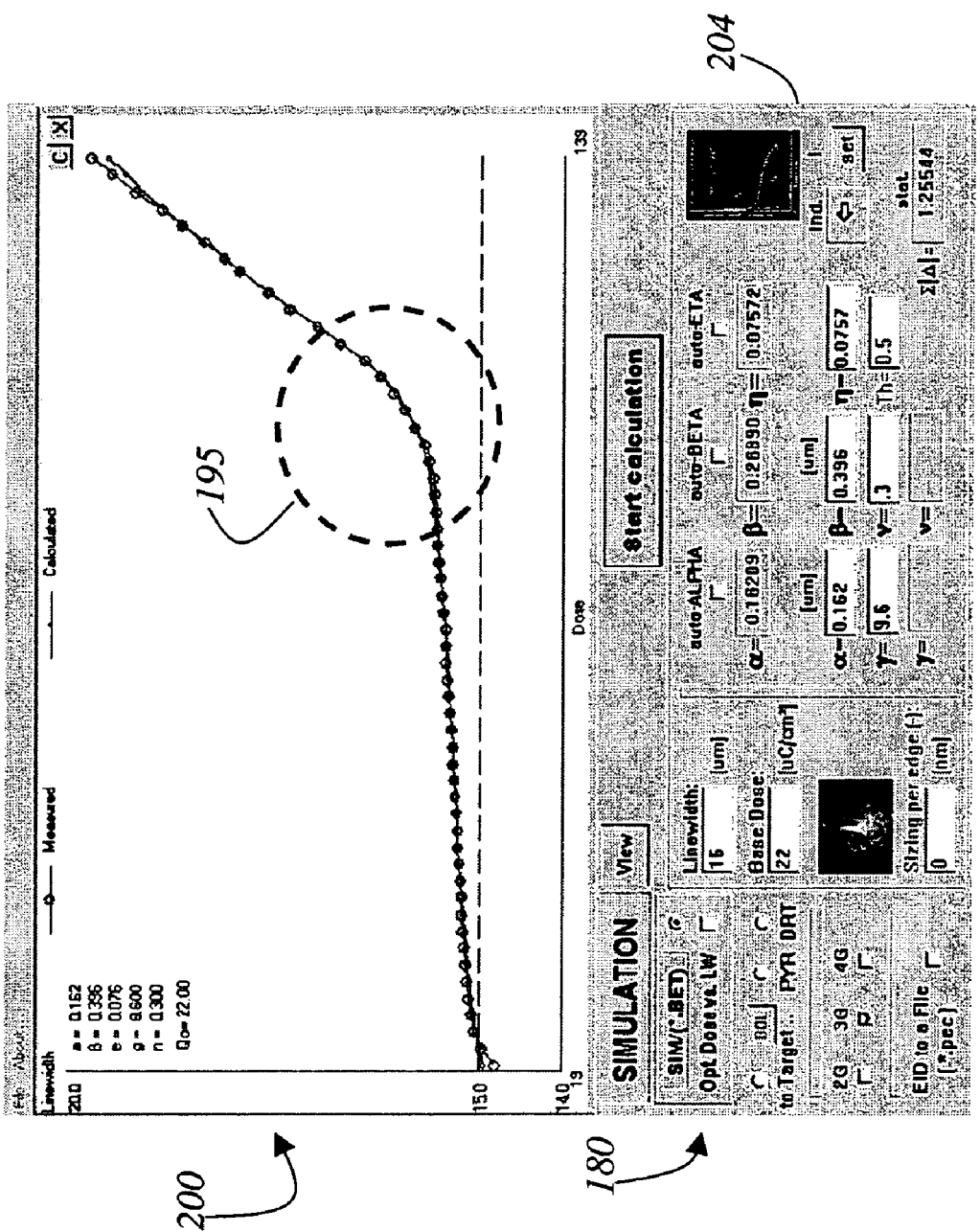
FIG. 19 shows the parameter-determination fitting process to experimental data from FIG. 17 using the Back-Simulation method and a 3 Gaussian "3G" approximation.

After each simulation step on the second portion 180 under "stat" 183 (see FIG. 18) a value appears indicating the quality of the just performed simulation. Generally, each step in the parameter-determination fitting process using the Back-Simulation method should tend to get the smallest possible value for "stat" 183 (e.g. see the difference in "stat" values between FIG. 18 and FIG. 19; obviously illustrating that FIG. 19 features the better fit 200).

The "ind" 193, 203 shows in form of an arrow "⇑" the quality-tendency of the fit among the fit-process. Pushing the "Set" button 194, 204 sets the current "stat" value as a min. for the quality evaluation and from now the indicator "ind" will show the fit-quality tendency in accordance to this value.

"ind"—meaning: "⇑"—worse; "⇓"—better, "⇔"—no significant change.

In case of a selected pattern type, except of "DRT", it is also possible to try separately each of the "auto-ALPHA", "auto-BETA", and "auto-ETA" functions (see FIG. 18) of the program (check the appropriate box, Note: only one must be checked at the same time!). The result is an optimized parameter value proposal for α or β or η appearing in the second portion 180 in red. If the calculated value proposal seems to be reliable, then it should be inserted into the appropriate Edit-Window below as a new value for the next simulation step. As a very first step in the auto-fit process it is recommended to start with the "auto-ETA" function—to find an approximately relevant and acceptable value of η. After inserting this value into the Edit-Window below the parameter-fit needs more iterations of many times through all input-parameters.

The boxes indicated as "3G" and "4G" (see the second portion 180 of the main window 120) are used to select more than two-Gaussian parameter sets. It often happens that some regions of the measurements cannot be satisfactorily fitted with simulations using the standard two Gaussian parameter sets (see FIG. 18; area marked with a dashed circle 195). In case the measured inputs of the line width variations are correct, this in reality could lead to a local failure of the optimised dose assignment for some combinations of patterns in the correction process. Using more than two Gaussians is in general possible in order to improve the quality of the fit (see FIG. 19).

Figure 20:
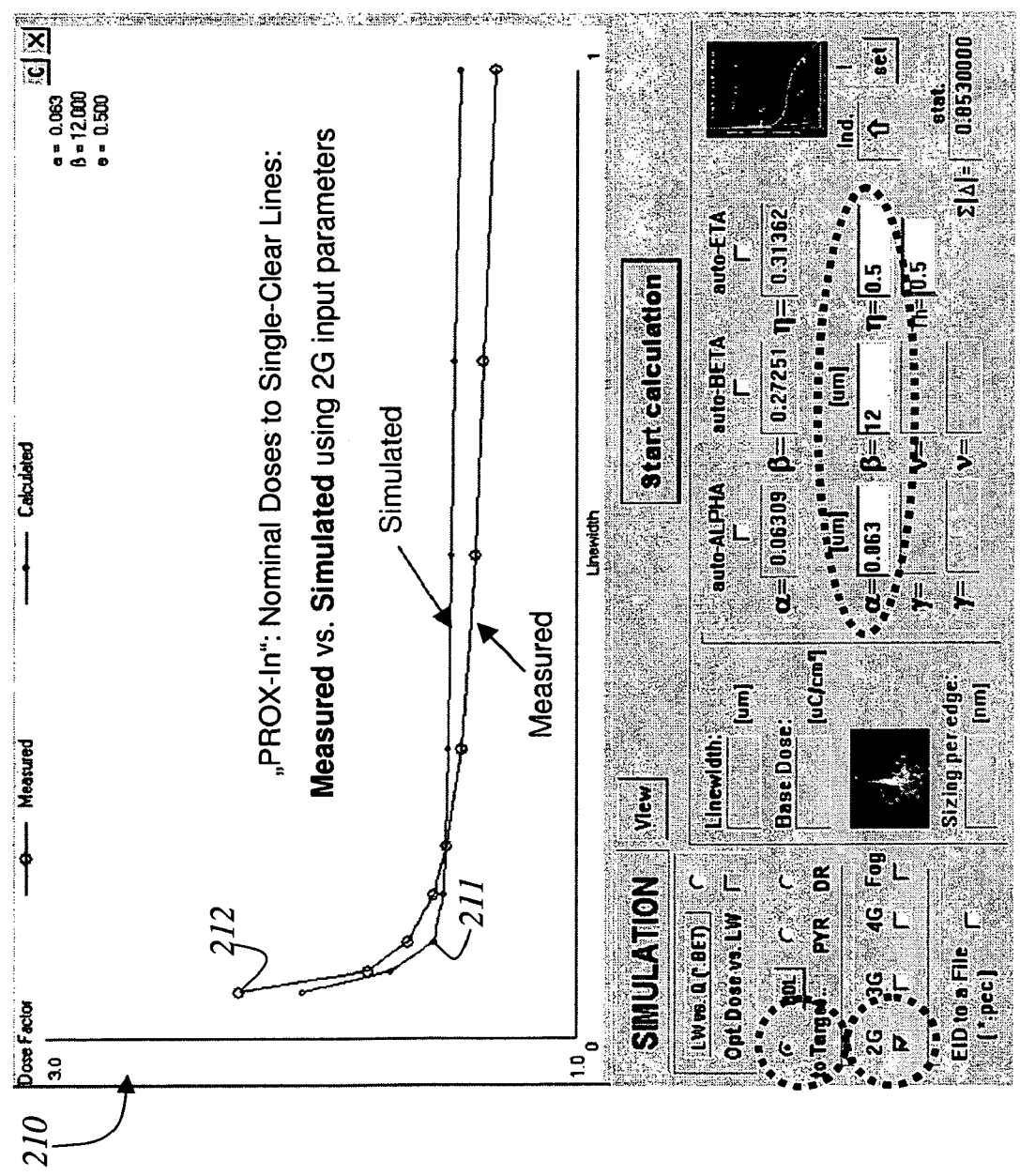
FIG. 20 shows the comparison of the measured optimal doses for the target line width of a single clear line and the simulated one; using "2G" approximations.

FIG. 20 shows a comparison 210 of the optimal doses for a measured line width 212 of a single clear line and the simulated one; using "2G" approximations. The calculated "Correction Curve" 211 using the "2G" approximation does not provide the best fit with respect to the measured data of the line width (proximity effect).

Figure 21:
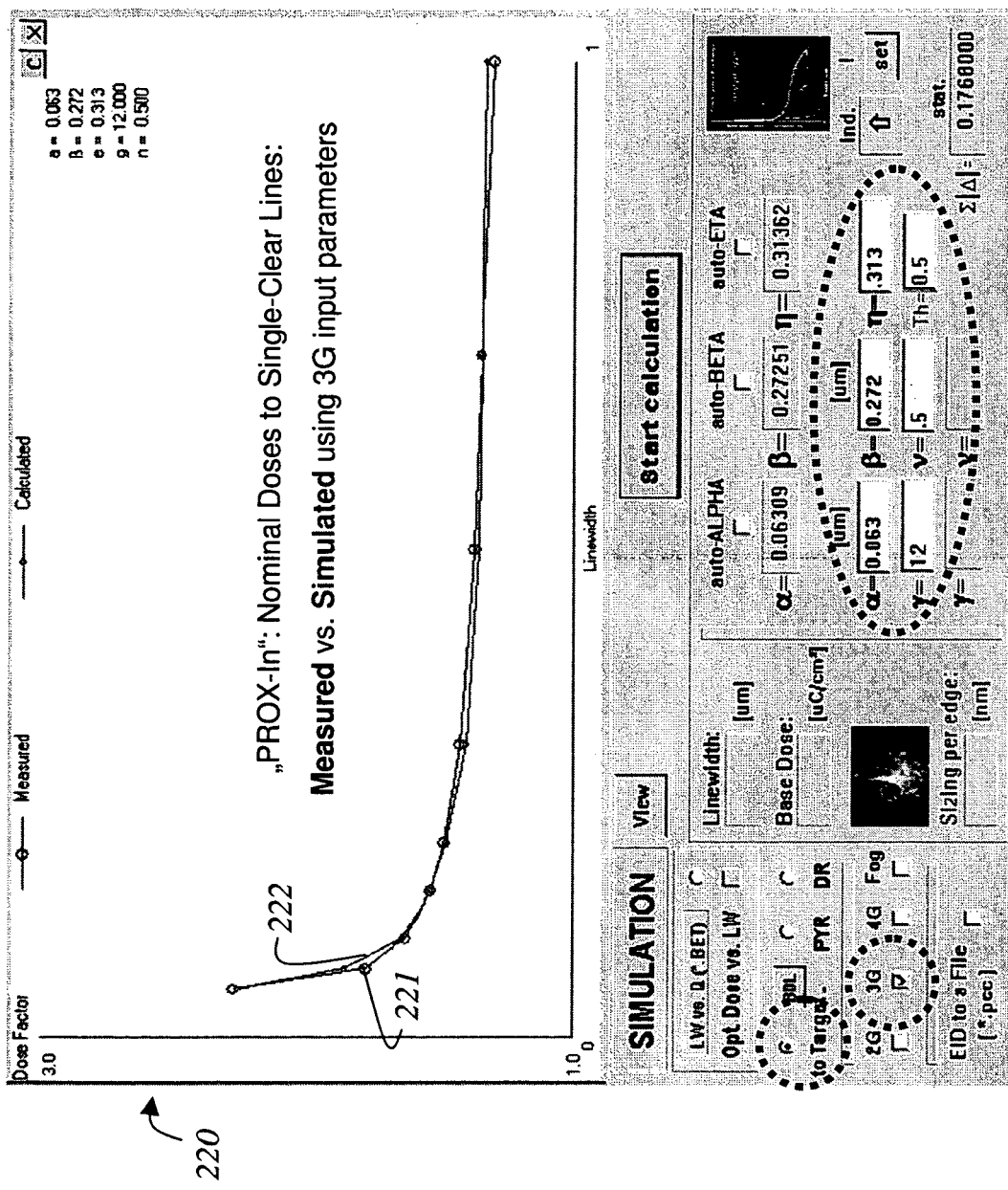
FIG. 21 shows the comparison of the measured optimal doses for the target line width of a single clear line ("Dose to Target") and the simulated one, using "3G" approximations.

FIG. 21 shows a comparison 220 of the optimal doses for a measured line width of a single clear line and the simulated one, using "3G" approximations. The calculated "Correction Curve" 221 using the "3G" approximation provides the best fit with respect to the measured data 222 of the line width (proximity effect).

Figure 21A:
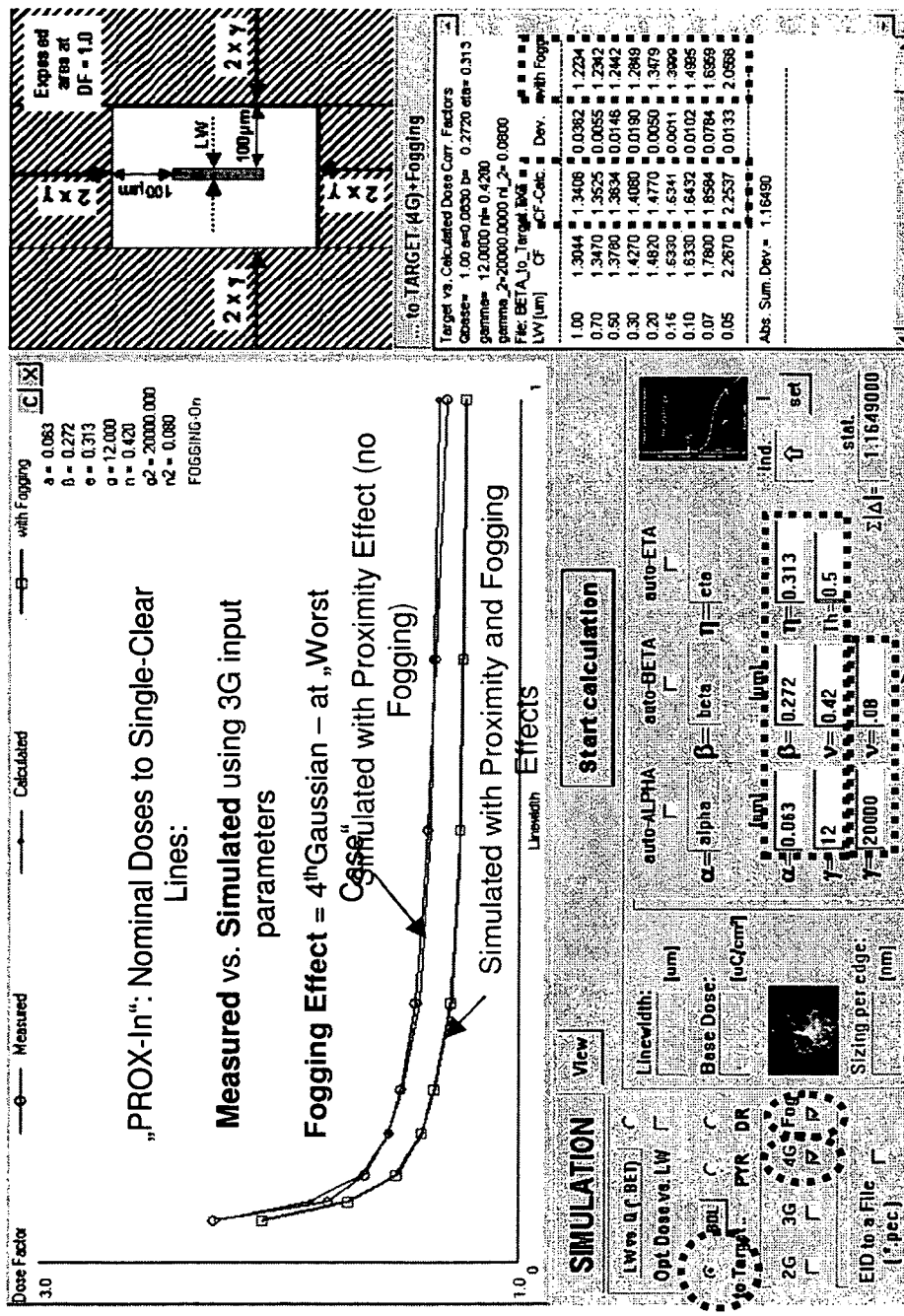
FIG. 21a shows the comparison of the measured optimal doses for the target of single clear lines from FIG. 21 and the simulated ones, using "3G" approximations and the same set of the single clear lines under fogging influence where the fogging parameters are included in the $4^{th}$ Gaussian added as a single common control function.

FIG. 21a shows the comparison of the measured optimal doses for the target of single clear lines from FIG. 21 and the simulated ones, using "3G" approximations and the same set of the single clear lines under fogging influence where the fogging parameters are included in the $4^{th}$ Gaussian added as a single common control function.

Figure 22:
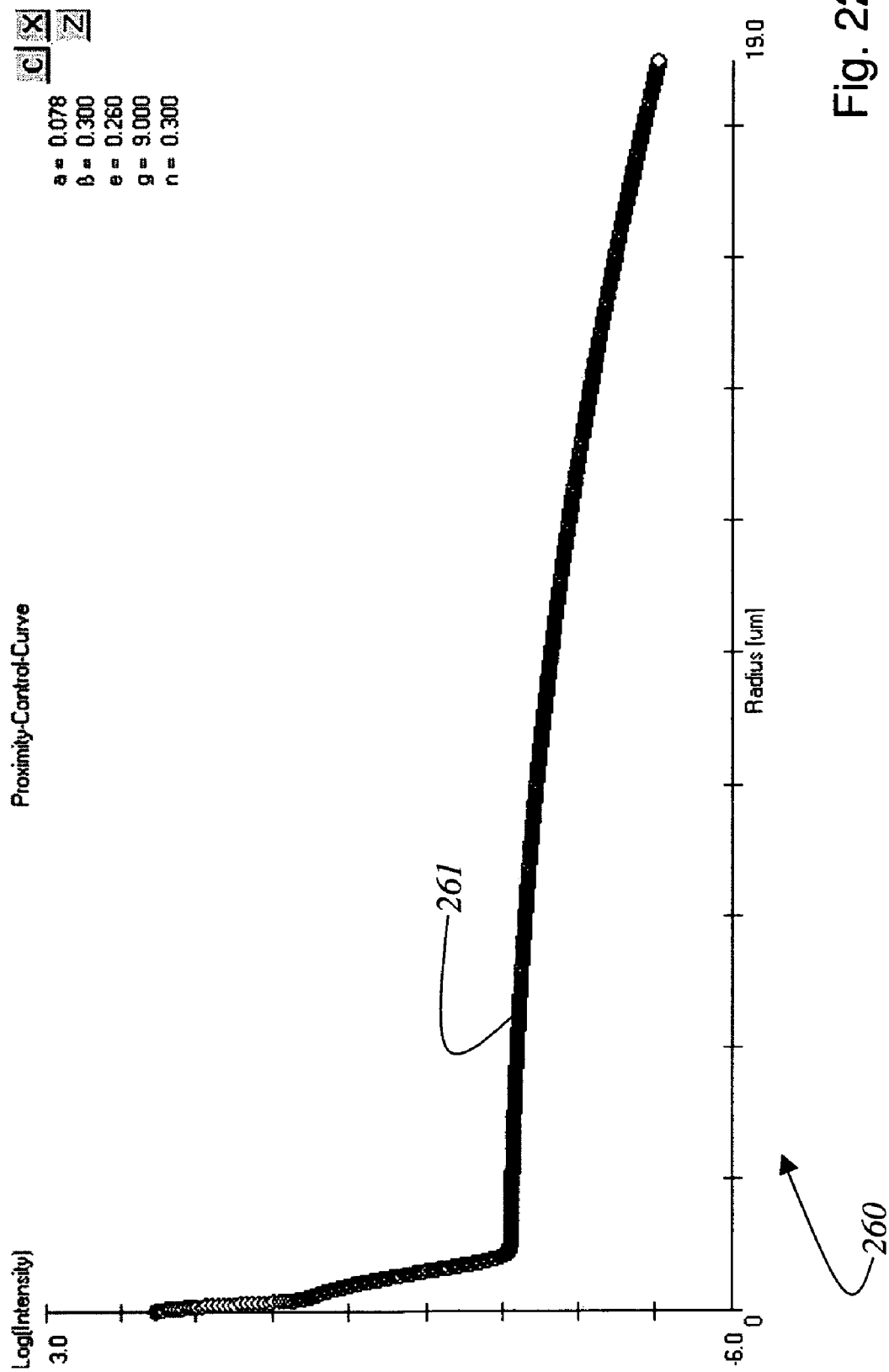
FIG. 22 shows a graph representation of the resulting "3G" proximity control function from FIG. 21 (still without fogging impact)

FIG. 22 shows a graph 230 representation of the resulting control function 231. The very last step in the whole parameter set determination process is the generation of the control function 231 for the exposure process optimization. The control function 231 is fully determined by the proximity input parameters $\alpha$, $\beta$, $\eta$ . . . .

The resulting control function 231 in the form of an "EID" (exposure Intensity Distribution) can be obtained in each step for one of the simulation steps after checking the "EID to a File (* .pec)" check-box. On the upper part of the display there is a graph representation of the control function resulting as Radial Distance [μm] vs. Exposure Intensity [arbitrary units].

Figure 23:
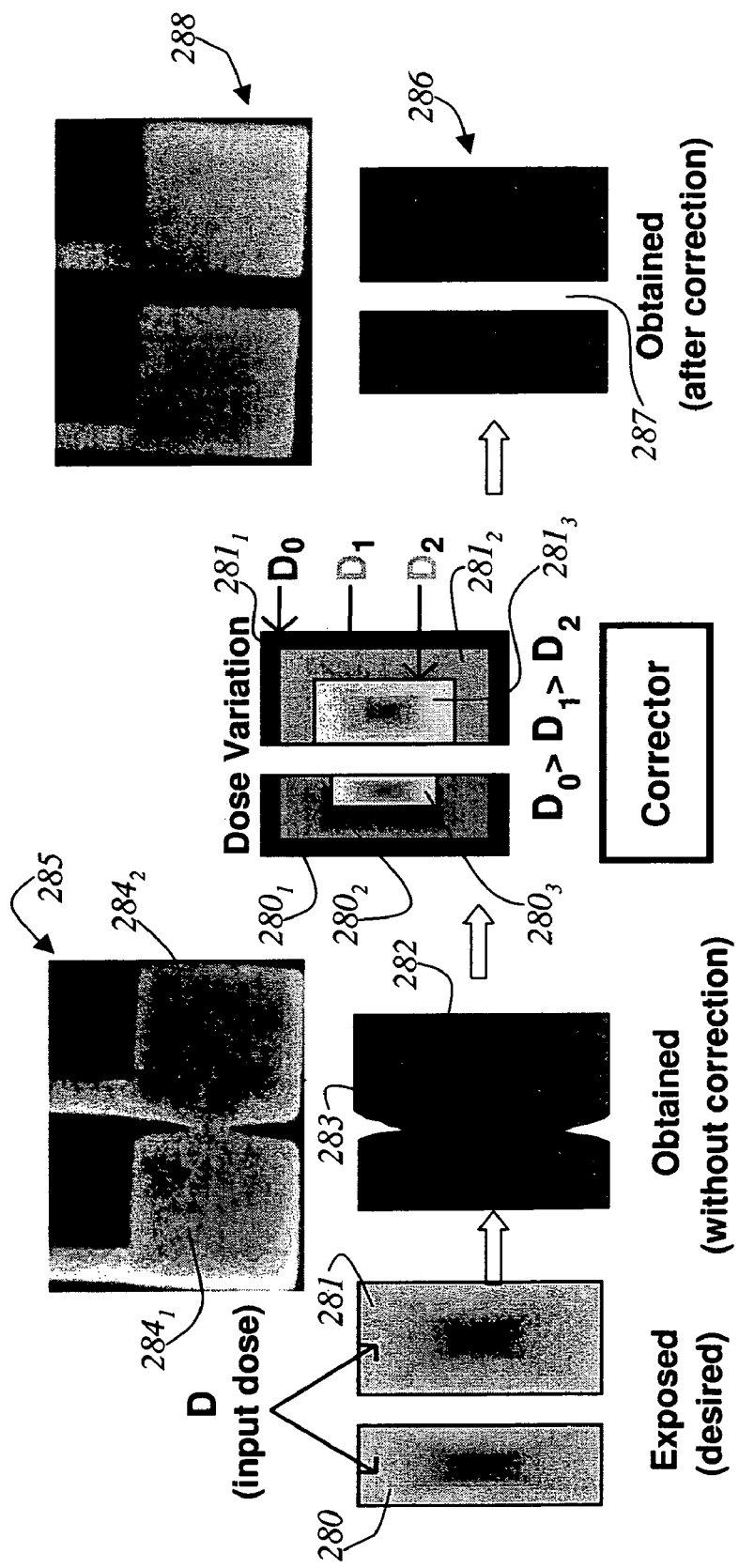
FIG. 23 shows a schematic representation of a pattern written with and without exposure correction.

FIG. 23 shows a schematic representation of a pattern written with and without the applied control function. To a first and a second area 280 and 281 a defined e-beam dose is assigned. A schematic representation 282 of the pattern resulting from the illumination by the e-beam shows a connection 283 between the individual lands $284_1$ and $284_2$. According to the CAD-data it is expected that the lands $284_1$ and $284_2$ are separated. The e-beam illumination causes the undesired connection between the two lands $284_1$ and $284_2$. A real image 285 of the structured pattern shows the connection between the two lands $284_1$ and $284_2$. According to the invention the first and the second area 280 and 281 are divided into at least two sub-areas $280_1$, $280_2$, . . . , $280_n$ and $281_1$, $281_2$, . . . , $281_n$ wherein a different dose is assigned to the sub-areas. According to the present embodiment the areas 280 and 281 are divided into three sub-areas $280_1$, $280_2$, and $280_3$. To each sub-area $280_1$, $280_2$, and $280_3$ an individual dose is assigned, wherein the first sub-area $280_1$ is subjected to a dose $D_0$, the second sub-area $280_2$ is subjected to a dose $D_1$, and the third sub-area $280_3$ is subjected to a dose $D_2$. As a result of the inventive assignment of the various doses to the various sub-areas a structure is obtained which has the dimensions as required by the CAD-data. A schematic representation of the various resulting structure 286 shows that there is a clear separation between the two structures. The separation is defined by a straight line 287 with a constant width. A real image 288 of the patterned structure is shown as well.

Figure 24:
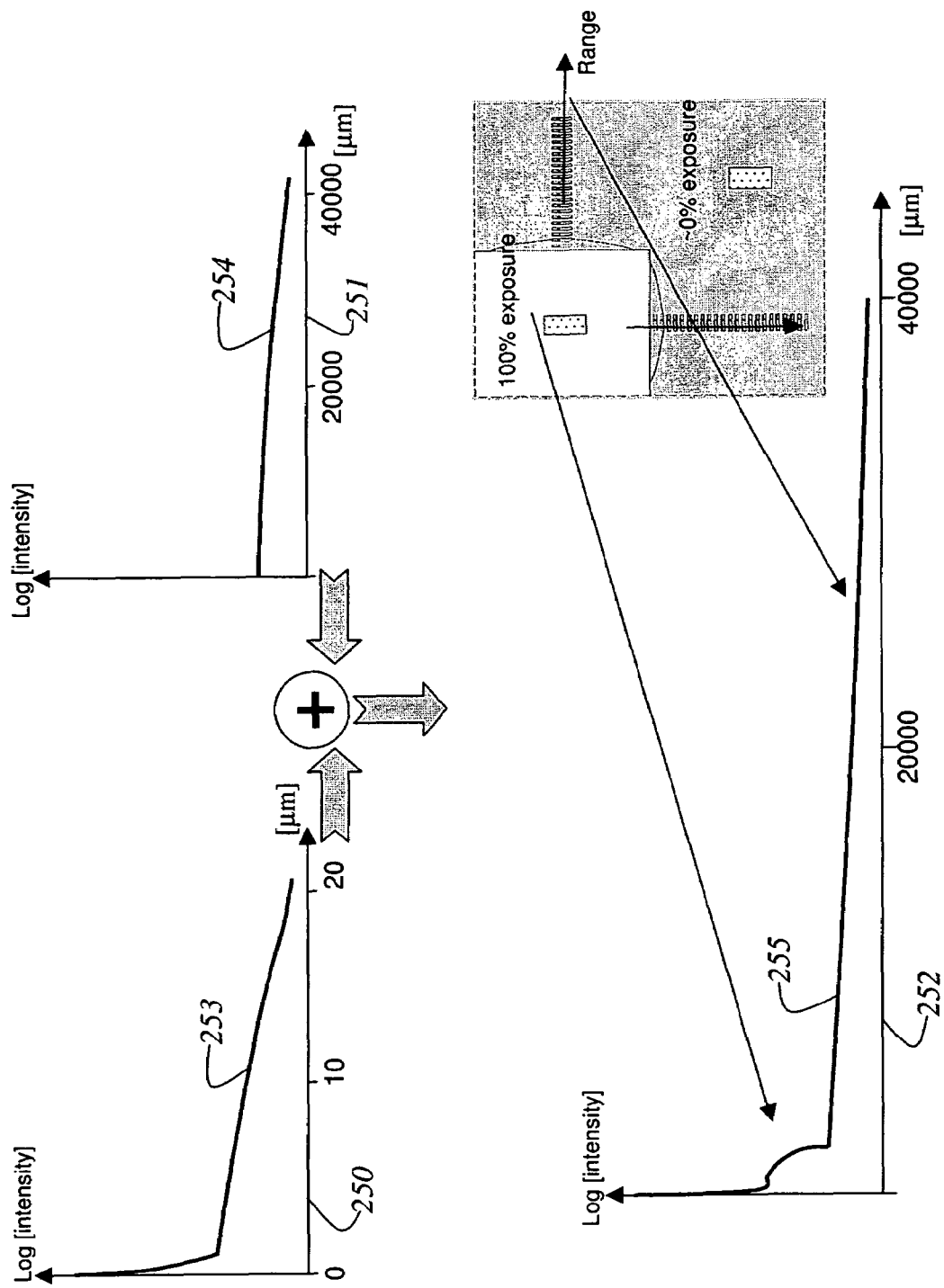
FIG. 24 shows a combined common short-range (Proximity) and long-range (Fogging) control function.

FIG. 24 shows in a first diagram 250 a graphical representation of the control function 253 for the proximity effect. A second diagram 251 is a graphical representation of the control function 254 for the fogging effect. A third diagram 252 shows a combined control function 255 for the proximity effect and the fogging effect.

What is claimed is:

1. Method for reducing the fogging effect in an electron beam lithography system, wherein the exposure is controlled in order to obtain patterns resulting after a process to optimize the global CD-uniformity over a whole mask or wafer which is conforming to design data comprising the steps of:

exposing proximity corrected test patterns;

measuring the geometry of the resulting test structures within the test pattern and thereby obtaining a set of measurement data showing the influence of the fogging effect on the dimensions as required by the design data;

determining basic fogging input parameters for a Gaussian or other function, the function type being chosen in accordance with a Kernel type used in a proximity corrector describing the fogging effect, from the set of measurement data;

fitting a model for the fogging effect by individually changing at least the basic fogging input parameters of the Gaussian or other function, by considering a proximity effect, to the set of measurement data and thereby obtaining an optimized set of parameters for a single common proximity and fogging control function; and applying the common proximity and fogging control function to an exposure control of the electron beam lithography system during the exposure of a pattern according to the design data, wherein the test patterns are surrounded by an exposed area with a separation gap between the test patterns and the exposure area boundary, and wherein the method further comprises the step of applying the individually changed fogging parameters to a calculation and comparing the calculated results with the set of measurement data.

2. The method as claimed in claim 1, wherein the method further includes a proximity effect correction to obtain the proximity corrected test patterns comprising the steps of:

exposing arbitrary set patterns applying the process for controlling the proximity correction;

measuring the geometry of the resulting test structures and thereby obtaining a set of measurement data;

determining basic input parameters of a proximity control function from the set of measurement data;

fitting a model by individually changing at least the basic input parameters of the proximity control function to measurement data set and thereby obtaining an optimised set of parameters, applying the control function to an exposure control of the electron beam lithography system during the exposure of a pattern according to the design data.

3. The method as claimed in claim 1, wherein the common proximity and fogging control function is a sum of at least two Gaussian functions.

4. The method as claimed in claim 1, wherein the common proximity and fogging control function for the proximity effect is determined by a sum of three Gaussian functions.

5. The method as claimed in claim 1, wherein the common proximity and fogging control function PF(r) is determined by:

$$PF(r)=c_f G_f(r)+c_b G_b(r)+c_{fog} G_{fog}(r),$$

wherein a first term with index f characterizes the short-range of forward scattering correction by a Gaussian function $G_f(r)$ multiplied with factor $C_f$, a second term with index b—the backscattering correction by a Gaussian function $G_f(r)$ multiplied with factor $c_f$, and a third term with index fog determines a Gaussian control function $G_{fog}(r)$ for the fogging effect, wherein r is a distance from a point of electron incidence.

6. The method as claimed in claim 1, wherein the common proximity and fogging control function for the proximity effect is determined by a sum of four Gaussian functions.

7. The method as claimed in claim 1, wherein with the use of a single control function for proximity and fogging effects correction with the e-beam lithographic system the dimensional errors over the whole wafer or mask are reduced to less than 10 nm.

8. The process as claimed in claim 2, wherein the proximity control function is embedded in a PROX-In software.

* * * * *